US010762955B2

(12) United States Patent
Sakai et al.

(10) Patent No.: US 10,762,955 B2
(45) Date of Patent: Sep. 1, 2020

(54) MEMORY SYSTEM

(71) Applicant: Toshiba Memory Corporation, Tokyo (JP)

(72) Inventors: Akihiko Sakai, Fujisawa Kanagawa (JP); Masanobu Shirakawa, Chigasaki Kanagawa (JP); Marie Takada, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/285,766

(22) Filed: Feb. 26, 2019

(65) Prior Publication Data

US 2020/0090740 A1   Mar. 19, 2020

(30) Foreign Application Priority Data

Sep. 14, 2018 (JP) .................................. 2018-173031

(51) Int. Cl.
| | | |
|---|---|---|
| *G11C 16/04* | (2006.01) | |
| *G11C 11/56* | (2006.01) | |
| *H01L 27/11556* | (2017.01) | |
| *G11C 29/52* | (2006.01) | |
| *H01L 27/11582* | (2017.01) | |

(52) U.S. Cl.
CPC ...... *G11C 11/5628* (2013.01); *G11C 11/5671* (2013.01); *G11C 29/52* (2013.01); *H01L 27/11556* (2013.01); *H01L 27/11582* (2013.01); *G11C 11/5642* (2013.01); *G11C 2211/5621* (2013.01)

(58) Field of Classification Search
CPC . G11C 16/0483; G11C 16/3459; G11C 16/08; G11C 16/10; G11C 11/5628; G11C 16/26; G11C 16/30; G11C 16/3427; G11C 16/3481; G11C 2211/5621
See application file for complete search history.

(56) References Cited

U.S. PATENT DOCUMENTS

| | | |
|---|---|---|
| 7,796,440 B2 | 9/2010 | Lee |
| 9,767,910 B1 | 9/2017 | Bushnaq et al. |
| 9,830,983 B1 | 11/2017 | Tokumasa et al. |

(Continued)

FOREIGN PATENT DOCUMENTS

JP            6297201 B2     3/2018

*Primary Examiner* — Thong Q Le
(74) *Attorney, Agent, or Firm* — Kim & Stewart LLP

(57) ABSTRACT

A memory system includes a storage device and a controller. The storage device includes a first string including a first memory cell transistor and a second memory cell transistor connected in series to each other, and a first select transistor, a second string including a third memory cell transistor and a second select transistor, a gate of the second select transistor being independent from a gate of the first select transistor. The controller configured to perform first writing to cause a threshold voltage of the first memory cell transistor to be lower than a first target threshold voltage, perform second writing to cause a threshold voltage of the second memory cell transistor to be higher than a second target threshold voltage after the first writing, perform third writing to cause a threshold voltage of the first memory cell transistor to be higher than the first target threshold voltage after the second writing, and perform fourth writing on the third memory cell transistor after the third writing.

6 Claims, 20 Drawing Sheets

(56) References Cited

U.S. PATENT DOCUMENTS

2014/0376310 A1* 12/2014 Kim .................. G11C 16/3427
                                                         365/185.02
2018/0075902 A1    3/2018  Shirakawa et al.

* cited by examiner

FIG. 10

| | | SU0 | | SU1 | | SU2 | | SU3 | |
|---|---|---|---|---|---|---|---|---|---|
| WL | CU | WT1 | WT2 | WT1 | WT2 | WT1 | WT2 | WT1 | WT2 |
| 7 | 7 | 14 | 16 | 30 | 32 | 46 | 48 | 62 | 64 |
| 6 | 6 | 12 | 15 | 28 | 31 | 44 | 47 | 60 | 62 |
| 5 | 5 | 10 | 13 | 26 | 29 | 42 | 45 | 58 | 61 |
| 4 | 4 | 8 | 11 | 24 | 27 | 40 | 43 | 56 | 59 |
| 3 | 3 | 6 | 9 | 22 | 25 | 38 | 41 | 54 | 57 |
| 2 | 2 | 4 | 7 | 20 | 23 | 36 | 39 | 52 | 55 |
| 1 | 1 | 2 | 5 | 18 | 21 | 34 | 37 | 50 | 53 |
| 0 | 0 | 1 | 3 | 17 | 19 | 33 | 35 | 49 | 51 |

| | | | |
|---|---|---|---|
| LOWER(CU(i+1)) | | | |
| MIDDLE(CU(i+1)) | | | |
| UPPER(CU(i+1)) | | | |
| TOP(CU(i+1)) | | | |
| LOWER(CUi) | | | |
| MIDDLE(CUi) | | | |
| UPPER(CUi) | | | |
| TOP(CUi) | | | |

RAM

FIG. 12

| WL | CU | SU0 WT1 | SU0 WT2 | SU1 WT1 | SU1 WT2 | SU2 WT1 | SU2 WT2 | SU3 WT1 | SU3 WT2 |
|---|---|---|---|---|---|---|---|---|---|
| 7 | 7 | 53 | 61 | 54 | 62 | 55 | 63 | 56 | 64 |
| 6 | 6 | 45 | 57 | 46 | 58 | 47 | 59 | 48 | 60 |
| 5 | 5 | 37 | 49 | 38 | 50 | 39 | 51 | 40 | 52 |
| 4 | 4 | 29 | 41 | 30 | 42 | 31 | 43 | 32 | 44 |
| 3 | 3 | 21 | 33 | 22 | 34 | 23 | 35 | 24 | 36 |
| 2 | 2 | 13 | 35 | 14 | 26 | 15 | 27 | 16 | 28 |
| 1 | 1 | 5 | 17 | 6 | 18 | 7 | 19 | 8 | 20 |
| 0 | 0 | 1 | 9 | 2 | 10 | 3 | 11 | 4 | 12 |

| SU0 | SU1 | SU2 | SU3 |
|---|---|---|---|
| LOWER(CU(i+1)) | LOWER(CU(i+1)) | LOWER(CU(i+1)) | LOWER(CU(i+1)) |
| MIDDLE(CU(i+1)) | MIDDLE(CU(i+1)) | MIDDLE(CU(i+1)) | MIDDLE(CU(i+1)) |
| UPPER(CU(i+1)) | UPPER(CU(i+1)) | UPPER(CU(i+1)) | UPPER(CU(i+1)) |
| TOP(CU(i+1)) | TOP(CU(i+1)) | TOP(CU(i+1)) | TOP(CU(i+1)) |
| LOWER(CUi) | LOWER(CUi) | LOWER(CUi) | LOWER(CUi) |
| MIDDLE(CUi) | MIDDLE(CUi) | MIDDLE(CUi) | MIDDLE(CUi) |
| UPPER(CUi) | UPPER(CUi) | UPPER(CUi) | UPPER(CUi) |
| TOP(CUi) | TOP(CUi) | TOP(CUi) | TOP(CUi) |

RAM

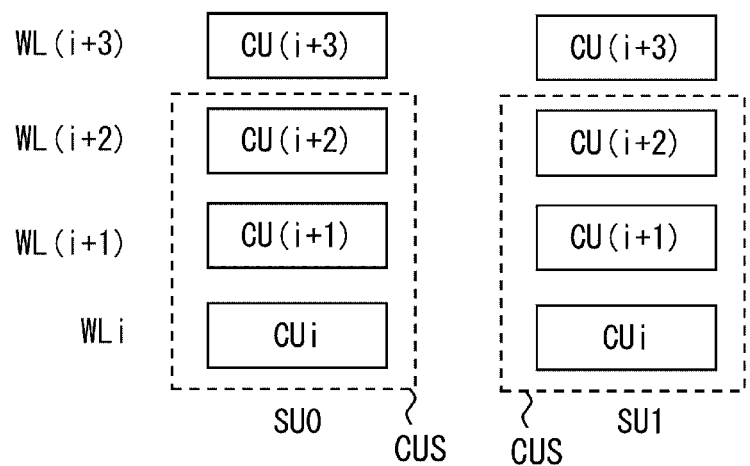

| WL | CU | SU0 | | SU1 | | SU2 | | SU3 | |
|---|---|---|---|---|---|---|---|---|---|
|   |   | WT1 | WT2 | WT1 | WT2 | WT1 | WT2 | WT1 | WT2 |
| 0 | 0 | 1UWT | | 1UWT | | 1UWT | | 1UWT | |
| 1 | 1 | | | | | | | | |
| 2 | 2 | | | | | | | | |
| 3 | 3 | | | | | | | | |
| 4 | 4 | | | | | | | | |
| 5 | 5 | | | | | | | | |
| 6 | 6 | | | | | | | | |
| 7 | 7 | | | | | | | | |

3UWT
2UWT
2UWT

FIG. 22
| WL | CU | SU0 | | SU1 | | SU2 | | SU3 | |
|---|---|---|---|---|---|---|---|---|---|
| 15 | 15 | 90 | | 97 | | 104 | | 111 | |
| 14 | 14 | 88 | 91 | 95 | 98 | 102 | 105 | 109 | 112 |
| 13 | 13 | 86 | 89 | 93 | 96 | 100 | 103 | 107 | 110 |
| 12 | 12 | 85 | 87 | 92 | 94 | 99 | 101 | 106 | 108 |
| 11 | 11 | 62 | | 69 | | 76 | | 83 | |
| 10 | 10 | 60 | 63 | 67 | 70 | 74 | 77 | 81 | 84 |
| 9 | 9 | 8 | 61 | 65 | 68 | 72 | 75 | 79 | 82 |
| 8 | 8 | 57 | 59 | 64 | 66 | 71 | 73 | 78 | 80 |
| DUMMY | | | | | | | | | |
| 7 | 7 | 34 | | 41 | | 48 | | 55 | |
| 6 | 6 | 32 | 35 | 39 | 42 | 46 | 49 | 53 | 56 |
| 5 | 5 | 30 | 33 | 37 | 40 | 44 | 47 | 51 | 54 |
| 4 | 4 | 29 | 31 | 36 | 38 | 43 | 45 | 50 | 52 |
| 3 | 3 | 6 | | 13 | | 20 | | 27 | |
| 2 | 2 | 4 | 7 | 11 | 14 | 18 | 21 | 25 | 28 |
| 1 | 1 | 2 | 5 | 9 | 12 | 16 | 19 | 23 | 26 |
| 0 | 0 | 1 | 3 | 8 | 10 | 15 | 17 | 22 | 24 |
| WL | CU | WT1 | WT2 | WT1 | WT2 | WT1 | WT2 | WT1 | WT2 |
 WRITING OF 3 PAGES
 WRITING OF 4 PAGES

FIG. 23

| WL | CU | SU0 | | SU1 | | SU2 | | SU3 | |
|---|---|---|---|---|---|---|---|---|---|
| 15 | 15 | 117 | 119 | 109 | 111 | 101 | 103 | 93 | 95 |
| 14 | 14 | 115 | 118 | 107 | 110 | 99 | 102 | 91 | 94 |
| 13 | 13 | 113 | 116 | 105 | 108 | 97 | 100 | 89 | 92 |
| 12 | 12 | 112 | 114 | 104 | 106 | 96 | 98 | 87 | 90 |
| 11 | 11 | 64 | | 71 | | 78 | | 85 | 88 |
| 10 | 10 | 62 | 65 | 69 | 72 | 76 | 79 | 83 | 86 |
| 9 | 9 | 60 | 63 | 67 | 70 | 74 | 77 | 81 | 84 |
| 8 | 8 | 58 | 61 | 66 | 68 | 73 | 75 | 80 | 82 |
| 7 | 7 | 56 | 59 | 49 | | 42 | | 35 | |
| 6 | 6 | 54 | 57 | 47 | 50 | 40 | 43 | 33 | 36 |
| 5 | 5 | 52 | 55 | 45 | 48 | 38 | 41 | 31 | 34 |
| 4 | 4 | 51 | 53 | 44 | 46 | 37 | 39 | 29 | 32 |
| 3 | 3 | 6 | | 13 | | 20 | | 27 | 30 |
| 2 | 2 | 4 | 7 | 11 | 14 | 18 | 21 | 25 | 28 |
| 1 | 1 | 2 | 5 | 9 | 12 | 16 | 19 | 23 | 26 |
| 0 | 0 | 1 | 3 | 8 | 10 | 15 | 17 | 22 | 24 |
| | | WT1 | WT2 | WT1 | WT2 | WT1 | WT2 | WT1 | WT2 |

FIG. 25
| WL | CU | SU0 | | SU1 | | SU2 | | SU3 | |
|---|---|---|---|---|---|---|---|---|---|
| | | WT1 | WT2 | WT1 | WT2 | WT1 | WT2 | WT1 | WT2 |
| 19 | 19 | 121 | | 128 | | 135 | | 142 | |
| 18 | 18 | 119 | 122 | 126 | 129 | 133 | 136 | 140 | 143 |
| 17 | 17 | 117 | 120 | 124 | 127 | 131 | 134 | 138 | 141 |
| 16 | 16 | 116 | 118 | 123 | 125 | 130 | 132 | 137 | 139 |
| DUMMY | | | | | | | | | |
| 15 | 15 | 114 | | 107 | | 100 | | 93 | |
| 14 | 14 | 112 | 115 | 105 | 108 | 98 | 101 | 91 | 94 |
| 13 | 13 | 110 | 113 | 103 | 106 | 96 | 99 | 89 | 92 |
| 12 | 12 | 109 | 111 | 102 | 104 | 95 | 97 | 87 | 90 |
| 11 | 11 | 64 | | 71 | | 78 | | 85 | 88 |
| 10 | 10 | 62 | 65 | 69 | 72 | 76 | 79 | 83 | 86 |
| 9 | 9 | 60 | 63 | 67 | 70 | 74 | 77 | 81 | 84 |
| 8 | 8 | 58 | 61 | 66 | 68 | 73 | 75 | 80 | 82 |
| 7 | 7 | 56 | 59 | 49 | | 42 | | 35 | |
| 6 | 6 | 54 | 57 | 47 | 50 | 40 | 43 | 33 | 36 |
| 5 | 5 | 52 | 55 | 45 | 48 | 38 | 41 | 31 | 34 |
| 4 | 4 | 51 | 53 | 44 | 46 | 37 | 39 | 29 | 32 |
| 3 | 3 | 6 | | 13 | | 20 | | 27 | 30 |
| 2 | 2 | 4 | 7 | 11 | 14 | 18 | 21 | 25 | 28 |
| 1 | 1 | 2 | 5 | 9 | 12 | 16 | 19 | 23 | 26 |
| 0 | 0 | 1 | 3 | 8 | 10 | 15 | 17 | 22 | 24 |
 WRITING OF 3 PAGES
 WRITING OF 4 PAGES

000
MEMORY SYSTEM

CROSS-REFERENCE TO RELATED APPLICATION

This application is based upon and claims the benefit of priority from Japanese Patent Application No. 2018-173031, filed on Sep. 14, 2018, the entire contents of which are incorporated herein by reference.

FIELD

Embodiments described herein relate generally to a memory system.

BACKGROUND

There is a memory system including a semiconductor memory and a controller controlling the semiconductor memory.

DESCRIPTION OF THE DRAWINGS

FIG. 10 is a table illustrating an order of data writing in the first embodiment.

FIG. 11 is a schematic diagram illustrating write data stored in a memory controller during writing in the first embodiment.

FIG. 12 is a table illustrating an order of data writing according to a reference example.

FIG. 13 is a schematic diagram illustrating write data stored in a memory controller during writing according to the reference example.

FIG. 15 is a conceptual diagram illustrating a string unit set according to the second embodiment.

FIG. 16 is a table illustrating a data writing method according to the second embodiment.

FIG. 22 is a table illustrating a data writing method according to the third embodiment.

FIG. 23 is a table illustrating a data writing method according to a fourth embodiment.

FIG. 25 is a table illustrating a data writing method according to a modification example of the fourth embodiment.

DETAILED DESCRIPTION

Figure 1:
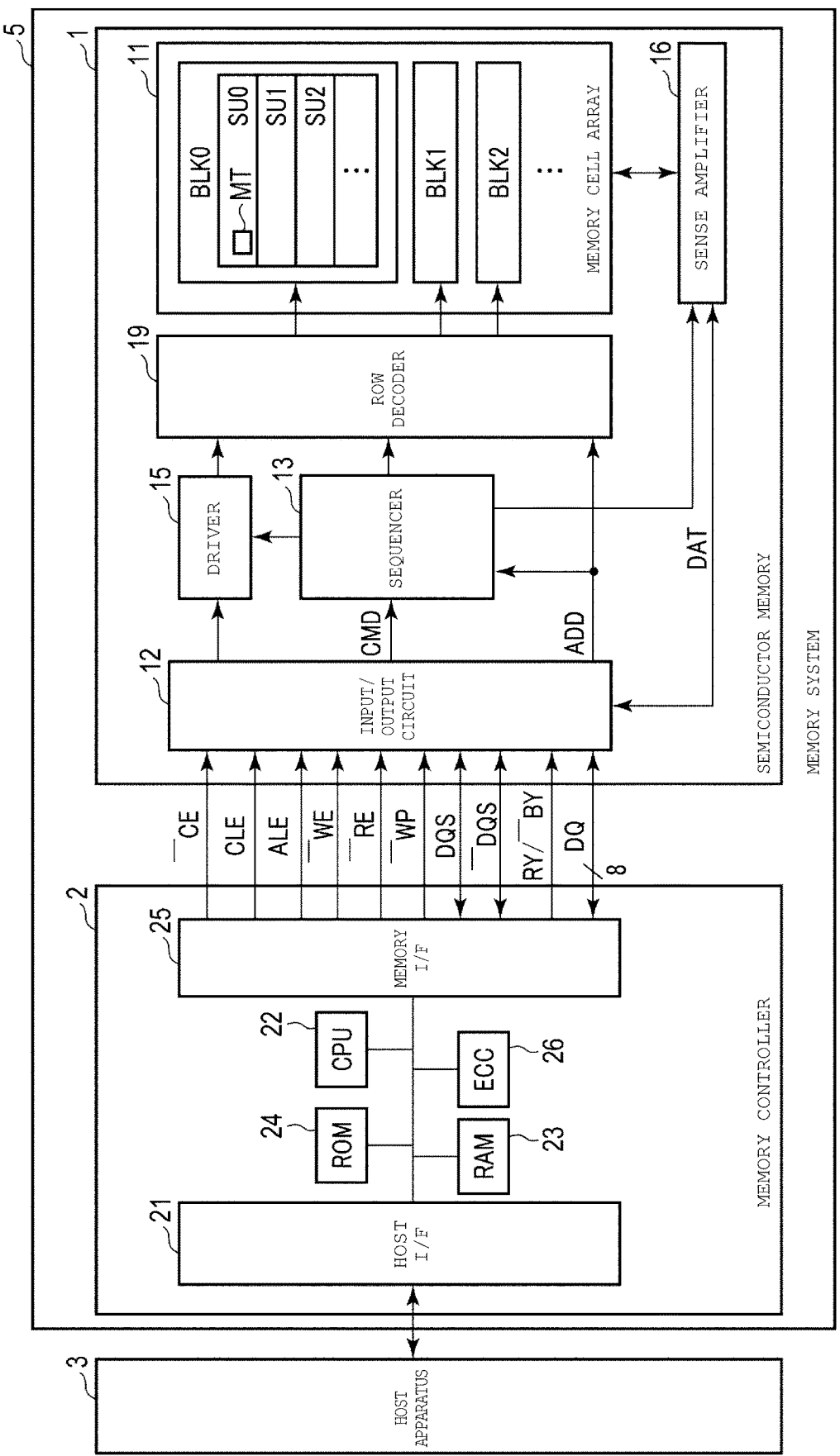
FIG. 1 is a block diagram illustrating elements and connection therebetween in a memory system according to a first embodiment.

Embodiments provide a memory system with high performance.

In general, according to an embodiment, a memory system includes a storage device and a controller. The storage device includes a first string including a first memory cell transistor and a second memory cell transistor connected in series to each other, and a first select transistor, a second string including a third memory cell transistor and a second select transistor, a gate of the second select transistor being independent from a gate of the first select transistor. The controller configured to perform first writing to cause a threshold voltage of the first memory cell transistor to be lower than a first target threshold voltage, perform second writing to cause a threshold voltage of the second memory cell transistor to be higher than a second target threshold voltage after the first writing, perform third writing to cause a threshold voltage of the first memory cell transistor to be higher than the first target threshold voltage after the second writing, and perform fourth writing on the third memory cell transistor after the third writing.

Hereinafter, embodiments will be described with reference to the drawings. In the following description, constituent elements having the substantially same function and configuration are given the same reference numeral, and repeated description will be omitted. Description of a certain embodiment may be applied to description of other embodiments as long as the description is explicitly or obviously excluded.

Each functional block may be implemented by either one of hardware and computer software or a combination thereof. Thus, each functional block is generally described from the viewpoint of its function such that it is clarified that the functional block is implemented by any one of them. It is not essential that each functional block is differentiated as in the following examples. For example, some functions may be executed by another functional block which is different from an exemplified functional block. An exemplified functional block may be divided into functional sub-blocks.

Any step in a flow regarding a method of an embodiment is not limited to an exemplified order, and may occur in an order which is different from the exemplified order and (or) in parallel to other steps unless otherwise mentioned.

In the present specification and claims, a certain first element "being connected" to another second element includes that the first element is connected to the second element directly, or normally or selectively via a conductive element.

First Embodiment

1.1 Structure (Configuration)

FIG. 1 illustrates elements and connection therebetween of a memory system according to a first embodiment. As illustrated in FIG. 1, a memory system 5 is controlled by a host apparatus 3, and includes a semiconductor memory 1 and a memory controller 2. The memory system 5 may be, for example, a solid state drive (SSD) or an SD™ card.

The semiconductor memory 1 is controlled by the memory controller 2. The memory controller 2 receives a command from the host apparatus 3, and controls the semiconductor memory 1 on the basis of the received command.

1.1.1 Memory Controller

The memory controller 2 includes a host interface 21, a central processing unit (CPU) 22, a random access memory (RAM) 23, a read only memory (ROM) 24, a memory interface 25, and an error correction code (ECC) circuit 26. Firmware (program) which is stored in the ROM 24 and is loaded to the RAM 23 is executed by the CPU 22. Thereby, the memory controller 2 executes various operations, and some functions of the host interface 21 and the memory interface 25. The RAM 23 temporarily stores data, and functions as a buffer memory and a cache memory.

The host interface 21 is connected to the host apparatus 3 via a bus, and performs communication between the memory controller 2 and the host apparatus 3. The memory interface 25 is connected to the semiconductor memory 1, and performs communication between the memory controller 2 and the semiconductor memory 1.

The ECC circuit 26 performs processes to detect and correct errors on data to be written into the semiconductor memory 1 and data read from the semiconductor memory 1. Specifically, the ECC circuit 26 generates redundancy data for correcting an error of data to be written (also referred to as actual write data) into the semiconductor memory 1. The generated redundancy data and the actual write data are written into the semiconductor memory 1 as write data. The ECC circuit 26 detects an error of data read from the semiconductor memory 1, and corrects an error when there is the error.

1.1.2 Semiconductor Memory

The semiconductor memory 1 includes elements such as a memory cell array 11, an input/output circuit 12, a sequencer 13, a driver 15, a sense amplifier 16, and a row decoder 19.

The memory cell array 11 includes a plurality of memory blocks (also simply referred to as blocks) BLK (for example, BLK0, BLK1, . . . ). Each block BLK is an aggregation of a plurality of string units SU (for example, SU0, SU1, . . . ). Each string unit SU is an aggregation of a plurality of NAND strings (also simply referred to as strings) STR (for example, STR0, STR1, . . . ) (not illustrated). Each string STR includes a plurality of memory cell transistors MT.

The input/output circuit 12 is connected to the memory controller 2 via a NAND bus. The NAND bus transmits a plurality of control signals and a signal DQ having an 8-bit width. The control signals include signals ⁻CE, CLE, ALE, ⁻WE, ⁻RE, ⁻WP, and data strobe signals DQS and ⁻DQS. The symbol "⁻" indicates an inversion logic. The input/output circuit 12 receives the signal DQ, and transmits the signal DQ. The input/output circuit 12 receives a control signal from the memory controller 2, and receives and outputs the signal DQ according to the control signal. The signal DQ includes a command CMD, write data or read data DAT, an address ADD, a status STA, and the like.

The sequencer 13 receives the command CMD and the address ADD from the input/output circuit 12, and controls the driver 15, the sense amplifier 16, and the row decoder 19 according to the command CMD and the address ADD.

The driver 15 supplies potentials selected from a plurality of potentials, to the row decoder 19. The row decoder 19 receives various potentials from the driver 15, receives the address ADD from the input/output circuit 12, and transmits the potentials from the driver 15, to a single block BLK which is selected according to the received address ADD.

The sense amplifier 16 senses a state of the memory cell transistor MT, generates read data on the basis of the sensed state, and transmits write data to the memory cell transistor MT.

1.1.3 Memory Cell Array

Figure 2:
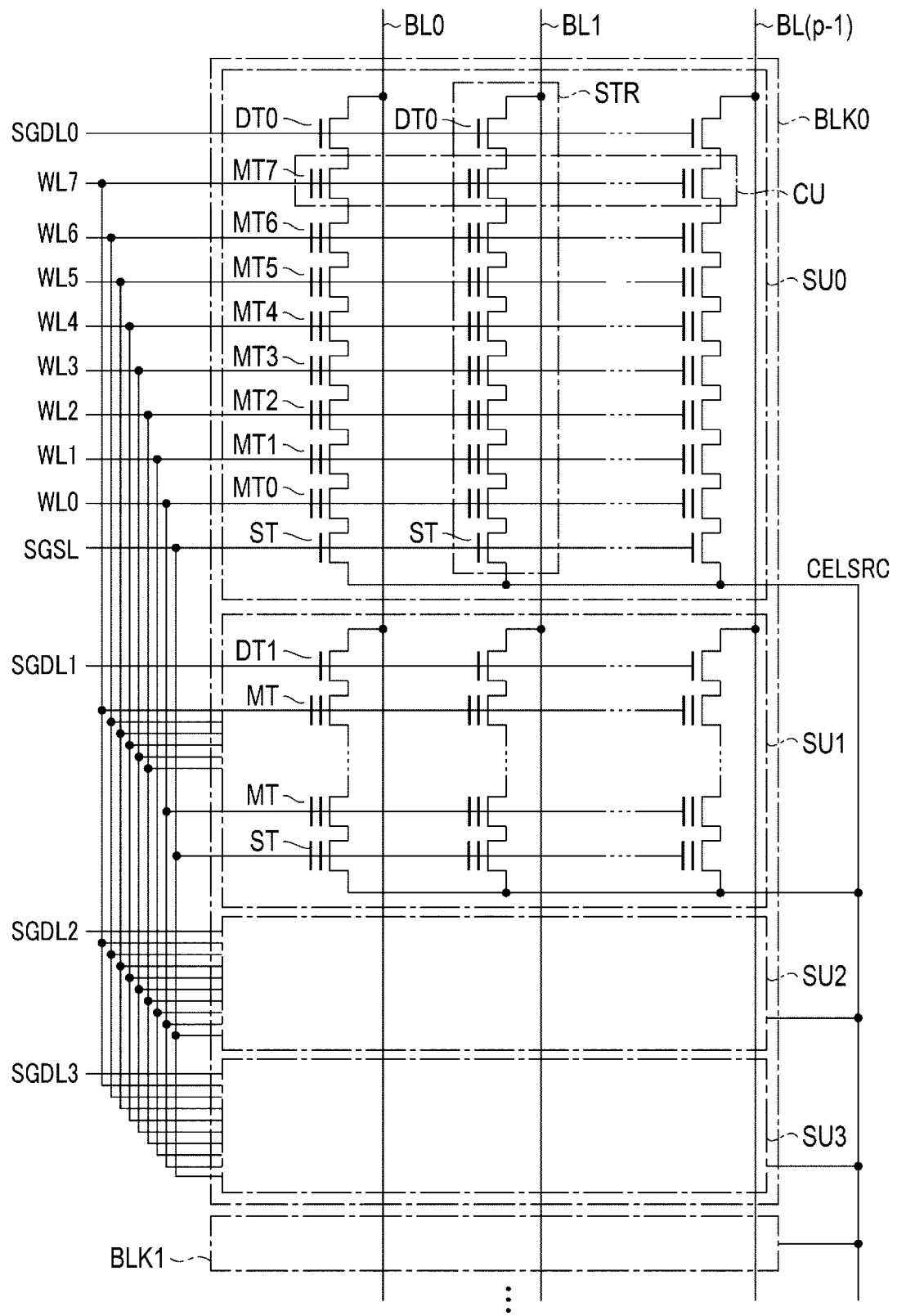
FIG. 2 is a circuit diagram illustrating examples of several elements and connection therebetween in a memory cell array of the first embodiment.

FIG. 2 illustrates examples of several elements and connection therebetween in the memory cell array 11 according to the first embodiment, and illustrates elements and connection therebetween of a single block BLK0, and related elements. A plurality of blocks BLK, for example, all blocks BLK include the elements and connection therebetween illustrated in FIG. 2.

A single block BLK includes a plurality of (for example, four) string units SU0 to SU3.

Each of p (where p is a natural number) bit lines BL0 to BL(p−1) is connected to a single string STR from each of the string units SU0 to SU3 in each block BLK.

Each string STR includes a single selection gate transistor ST, a plurality of (for example, eight) memory cell transistors MT (for example, MT0 to MT7), and a single selection gate transistor DT (for example, DT0, DT1, DT2, or DT3). The transistors ST, MT, and DT are connected in series in this order between a source line CELSRC and a single bit line BL. The memory cell transistor MT includes a control gate electrode (that is, a word line WL) and a charge storage layer insulated from the surrounding, and may maintain data in a nonvolatile manner on the basis of an amount of electric charge in the charge storage layer.

A plurality of strings STR are respectively connected to a plurality of different bit lines BL and form a single string unit SU. In each string unit SU, control gate electrodes of the memory cell transistors MT0 to MT7 are respectively connected to the word lines WL0 to WL7. In each block BLK, the word lines WL having the same ID (address) in different string units SU are connected to each other. A set of memory cell transistors MT sharing the word line WL in a single string unit SU is referred to as a cell unit CU.

The transistors DT0 to DT3 (FIG. 2 does not illustrate DT2 and DT3) are respectively provided in the string units SU0 to SU3. With respect to respective cases of α=0 to 3, a gate of the transistor DTα of each of a plurality of strings STR of the string unit SUα is connected to a select gate line SGDLα. A gate of the transistor ST is connected to a select gate line SGSL.

Figure 3:
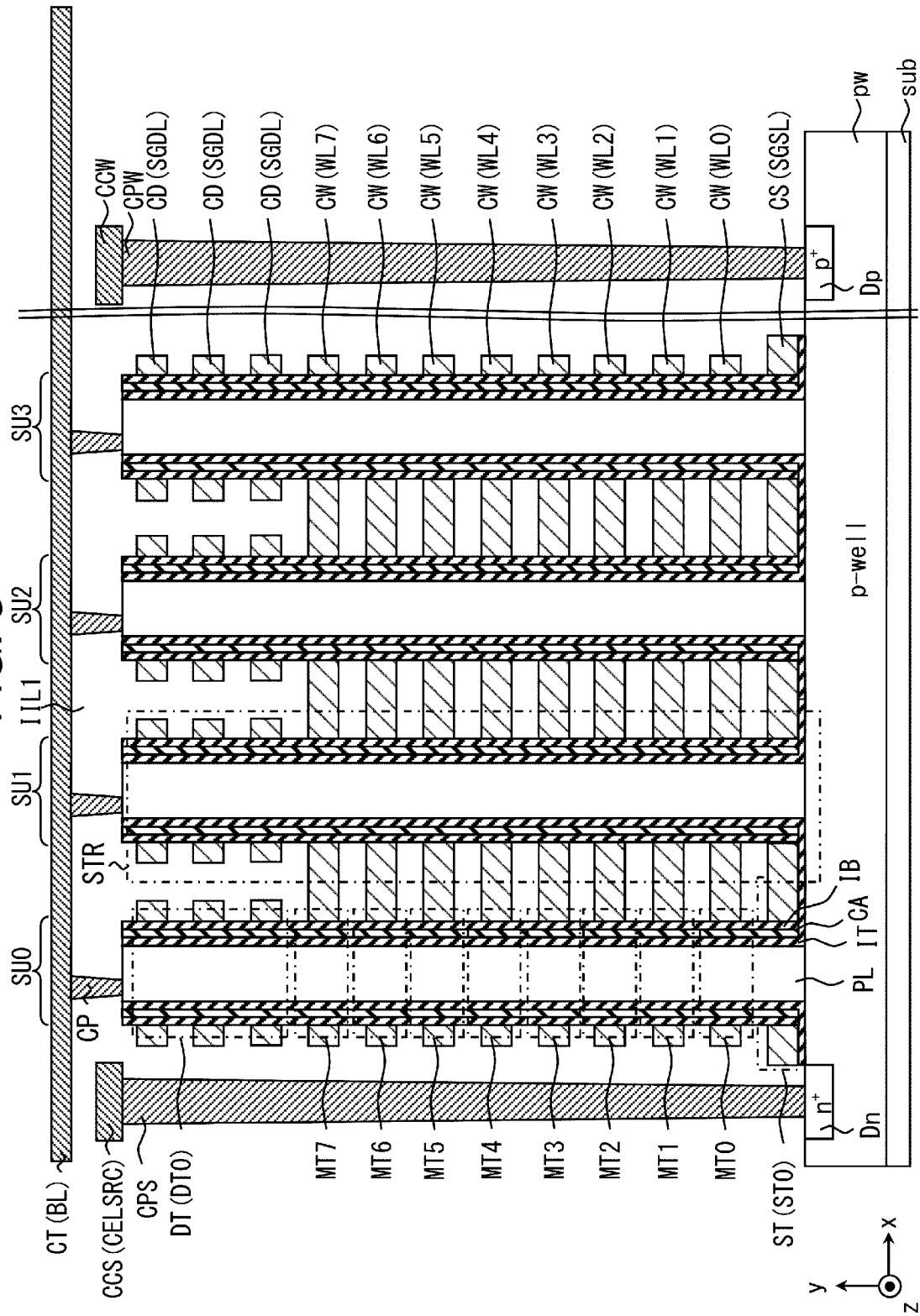
FIG. 3 is a cross-sectional diagram illustrating elements and connection therebetween in a memory block of the first embodiment.

Each block BLK may have a structure illustrated in FIG. 3. FIG. 3 schematically illustrates a structure of a part of the memory cell array of the first embodiment. As illustrated in FIG. 3, the string unit SU is provided on a substrate sub. The substrate sub extends along an xy plane and includes a p-type well pw in a surface region. Each string unit SU includes a plurality of strings STR arranged along the x axis. Each string STR includes a semiconductor pillar PL. The pillar PL extends along the z axis, is in contact with the well pw, and functions as a channel region in which channels of the transistors MT, DT, and ST are formed, and a body. An upper end of the pillar PL is connected to a conductor CT via conductive plug CP. The conductor CT extends along the y axis to function as a single bit line BL, and has a gap with the conductor CT located at another coordinate on the x axis. A side surface of the pillar PL is covered with a tunnel insulator (layer) IT. The tunnel insulator IT is also located on the well pw. A side surface of the tunnel insulator IT is covered with a charge storage layer CA. The charge storage layer CA is an insulating layer or a conductive layer, and a side surface thereof is covered with a block insulator (layer) IB.

In each string unit SU, a single conductor CS, a plurality of (for example, eight) conductors CW, and a plurality of (for example, three) conductors CD are provided over the well pw. A plurality of conductors CS may be provided. The conductors CS, CW, and CD are arranged in this order with gaps along the z axis, and extend along the x axis to contact the block insulator IB. The conductor CS interposes the tunnel insulator IT with the surface of the well pw. The conductors CS, CW, and CD function as the select gate line SGSL, the word lines WL0 to WL7, and the select gate lines SGDL, respectively. In each string unit SU, the conductors CS, CW, and CD are in internal contact with the block insulators IB on the side surfaces of all of the pillars PL in the string unit SU.

In the pillar PL, the tunnel insulator IT, the charge storage layer CA, and the block insulator IB, portions intersecting the conductors CS, CW, and CD function as the selection gate transistor ST, the memory cell transistors MT, and the selection gate transistor DT, respectively. The transistors ST, MT, and DT sharing the pillar PL and arranged along the z axis form a single string STR.

A diffusion layer Dp of p+ type impurities is provided in a region inside the surface of the well pw. The diffusion layer Dp is connected to a conductor CCW via a conductive plug CPW. The plug CPW is spread along an xz plane.

A diffusion layer Dn of n+ type impurities is also provided in the region in the surface of the well pw. The diffusion layer Dn is connected to a conductor CCS via a conductive plug CPS. The conductor CCS functions as the source line CELSRC.

An insulator IIL1 is provided in a region in which the conductors CS, CW, CD, CCS, and CCW, and the plugs CPS and CPW are not provided on the substrate sub.

1.1.4 Memory Cell Transistor

Figure 4:
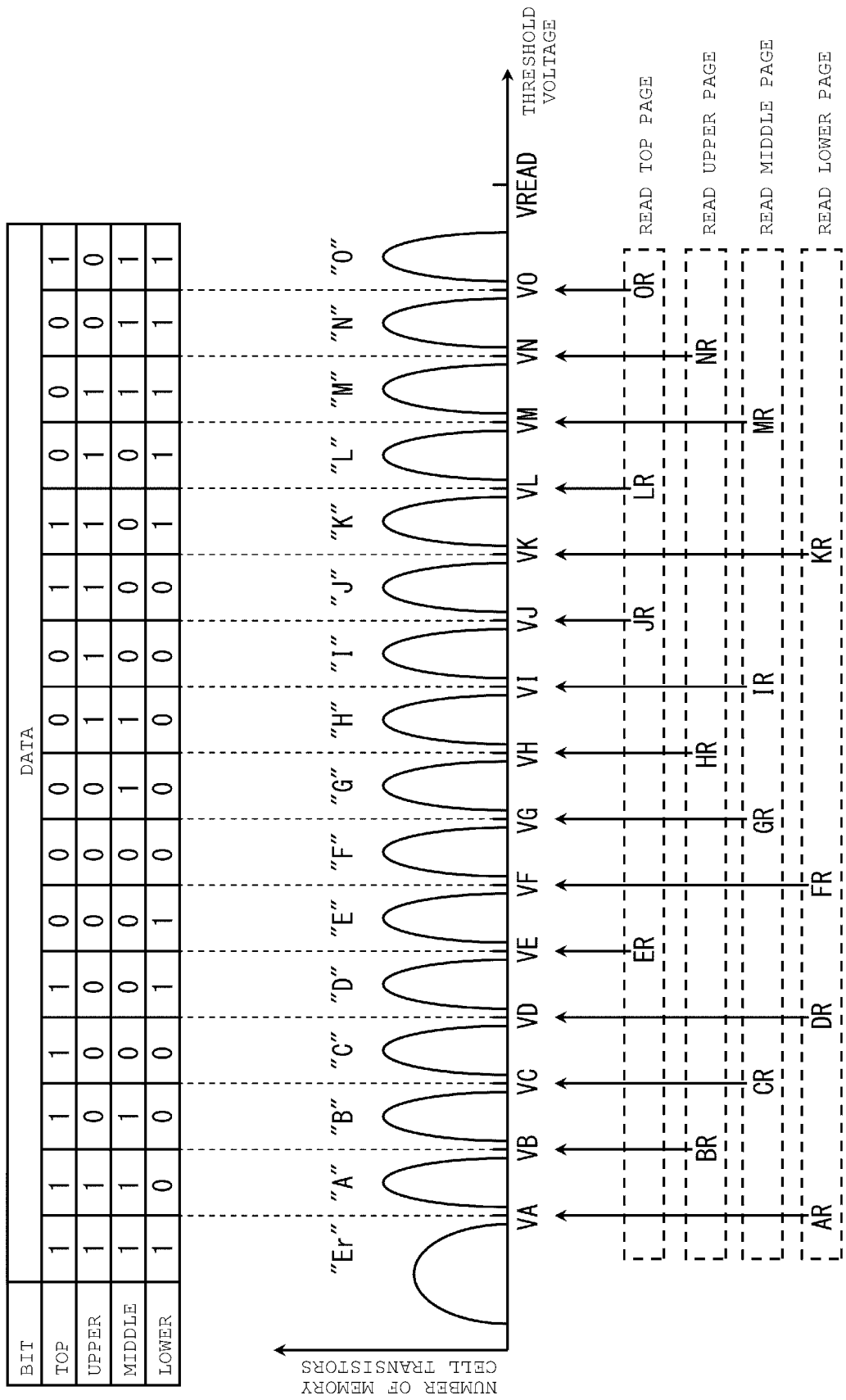
FIG. 4 is a diagram illustrating a distribution of threshold voltages of a memory cell transistor holding 4-bit data of the first embodiment.

With reference to FIG. 4, the memory cell transistor MT will be described. The semiconductor memory 1 may store data of 2 or more bits in a single memory cell transistor MT. FIG. 4 illustrates a distribution of threshold voltages of the memory cell transistor MT storing 4-bit data per memory cell transistor MT as a result of data writing in the memory system according to the first embodiment. A threshold voltage of each memory cell transistor MT has a value corresponding to stored data. When 4 bits are stored in each memory cell transistor MT, each memory cell transistor MT may have any one of 16 threshold voltages. The 16 threshold voltages are in states of storing data of "1111", data of "1110", data of "1010", data of "1000", data of "1001", data of "0001", data of "0000", data of "0010", data of "0110", data of "0100", data of "1100", data of "1101", data of "0101", data of "0111", data of "0011", and data of "1011", respectively. The memory cell transistor MT in in states of storing data of "1111", data of "1110", data of "1010", data of "1000", data of "1001", data of "0001", data of "0000", data of "0010", data of "0110", data of "0100", data of "1100", data of "1101", data of "0101", data of "0111", data of "0011", and data of "1011" will be referred to as being in Er, A, B, C, D, E, F, G, H, I, J, K, L, M, N, and O states, respectively. The memory cell transistor MT in the Er state, the A state, the B state, the C state, the D state, the E state, the F state, the G state, the H state, the I state, the J state, the K state, the L state, the M state, the N state, and the O state has a higher threshold voltage in this order.

Even a plurality of memory cell transistors MT storing identical 4-bit data may have different threshold voltages due to a variation in characteristics of the memory cell transistors MT. In FIG. 4 and the subsequent drawings, a distribution of threshold voltages is indicated by consecutive curves, but, actually, the number of memory cell transistors MT is discrete.

A state of the corresponding memory cell transistor MT is determined in order to determine data stored in the read target memory cell transistor MT. In order to determine a state, read voltages VA, VB, VC, VD, VE, VF, VG, VH, VI, VJ, VK, VL, VM, VN, and VO are used. Hereinafter, a voltage with a predetermined magnitude applied to the read target memory cell transistor MT, including the read voltages VA, VB, VC, VD, VE, VF, VG, VH, VI, VJ, VK, VL, VM, VN, and VO, in order to determine a state of the memory cell transistor MT, may be referred to as a read voltage VCGR.

The read voltage VA is higher than the highest threshold voltage of the memory cell transistor MT in the Er state, and is lower than the lowest threshold voltage of the memory cell transistor MT in the A state right after writing is performed.

The read voltage VB is higher than the highest threshold voltage of the memory cell transistor MT in the A state right after writing is performed, and is lower than the lowest threshold voltage of the memory cell transistor MT in the B state right after writing is performed.

The read voltage VC is higher than the highest threshold voltage of the memory cell transistor MT in the B state right after writing is performed, and is lower than the lowest threshold voltage of the memory cell transistor MT in the C state right after writing is performed.

The read voltage VD is higher than the highest threshold voltage of the memory cell transistor MT in the C state right after writing is performed, and is lower than the lowest threshold voltage of the memory cell transistor MT in the D state right after writing is performed.

The read voltage VE is higher than the highest threshold voltage of the memory cell transistor MT in the D state right after writing is performed, and is lower than the lowest threshold voltage of the memory cell transistor MT in the E state right after writing is performed.

The read voltage VF is higher than the highest threshold voltage of the memory cell transistor MT in the E state right after writing is performed, and is lower than the lowest threshold voltage of the memory cell transistor MT in the F state right after writing is performed.

The read voltage VG is higher than the highest threshold voltage of the memory cell transistor MT in the F state right after writing is performed, and is lower than the lowest threshold voltage of the memory cell transistor MT in the G state right after writing is performed.

The read voltage VH is higher than the highest threshold voltage of the memory cell transistor MT in the G state right after writing is performed, and is lower than the lowest threshold voltage of the memory cell transistor MT in the H state right after writing is performed.

The read voltage VI is higher than the highest threshold voltage of the memory cell transistor MT in the H state right after writing is performed, and is lower than the lowest threshold voltage of the memory cell transistor MT in the I state right after writing is performed.

The read voltage VJ is higher than the highest threshold voltage of the memory cell transistor MT in the I state right after writing is performed, and is lower than the lowest threshold voltage of the memory cell transistor MT in the J state right after writing is performed.

The read voltage VK is higher than the highest threshold voltage of the memory cell transistor MT in the J state right after writing is performed, and is lower than the lowest threshold voltage of the memory cell transistor MT in the K state right after writing is performed.

The read voltage VL is higher than the highest threshold voltage of the memory cell transistor MT in the K state right after writing is performed, and is lower than the lowest threshold voltage of the memory cell transistor MT in the L state right after writing is performed.

The read voltage VM is higher than the highest threshold voltage of the memory cell transistor MT in the L state right after writing is performed, and is lower than the lowest threshold voltage of the memory cell transistor MT in the M state right after writing is performed.

The read voltage VN is higher than the highest threshold voltage of the memory cell transistor MT in the M state right after writing is performed, and is lower than the lowest threshold voltage of the memory cell transistor MT in the N state right after writing is performed.

The read voltage VO is higher than the highest threshold voltage of the memory cell transistor MT in the N state right after writing is performed, and is lower than the lowest threshold voltage of the memory cell transistor MT in the O state right after writing is performed.

The read voltages VA, VB, VC, VD, VE, VF, VG, VH, VI, VJ, VK, VL, VM, VN, and VO are, for example, default voltages. Reading using a read voltage VX (where X is A, B, C, D, E, F, G, H, I, J, K, L, M, N, or O) will be referred to as X reading (XR).

A range of a threshold voltage of the read target memory cell transistor MT is used to calculate a state of the memory cell transistor MT. In order to calculate a range of a threshold voltage of the read target memory cell transistor MT, it is determined whether or not the read target memory cell transistor MT exceeds a certain read voltage VCGR. The memory cell transistor MT having a threshold voltage which is equal to or higher than the read voltage VCGR is maintained in an OFF state even if the read voltage VCGR is applied to the control gate electrode thereof. On the other hand, the memory cell transistor MT having a threshold voltage which is lower than the read voltage VCGR is turned on when the read voltage VCGR is applied to the control gate electrode thereof. A voltage VREAD is applied to the word line WL of the memory cell transistor MT of a non-read target cell unit CU, and is higher than a threshold voltage of the memory cell transistor MT in any state.

A set of data of bits at an identical position (that is, a digit) of the memory cell transistors MT of a single cell unit CU configures a single page. A set of data of the most significant (that is, the first digit) bits of the memory cell transistors MT of each cell unit CU will be referred to as a top page. A set of data of bits in the second digit from the most significant bits of the memory cell transistors MT of each cell unit CU will be referred to as an upper page. A set of data of bits in the third digit from the most significant bits of the memory cell transistors MT of each cell unit CU will be referred to as a middle page. A set of data of the least significant (that is, the fourth digit) bits of the memory cell transistors MT of each cell unit CU will be referred to as a lower page.

Data of each page is calculated through reading using a plurality of read voltages VCGR having different values. Examples thereof will be described below. Respective bits of a lower page are respectively calculated through A reading, D reading, F reading, and K reading. Middle page data is calculated through C reading, G reading, I reading, and M reading. Upper page data is calculated through B reading, H reading, and N reading. Top page data is calculated through E reading, J reading, L reading, and O reading.

1.2 Operation

The memory system 5 writes data into a write target cell unit (selected cell unit) CU by using two-step writing. The two-step writing includes first writing and second writing. Both of the first writing and the second writing include repetition of a plurality of program loops.

Each program loop includes programming and verification. The programming indicates that a threshold voltage of a program target memory cell transistor MT is increased by injecting electrons into the charge storage layer of the program target memory cell transistor MT, or a threshold voltage thereof is maintained by inhibiting injection of electrons. A string STR including the program target memory cell transistor MT into which electrons are injected will be referred to as a programmable string STR(p), and a bit line BL connected to the programmable string STR(p) will be referred to as a programmable bit line BL(p). On the other hand, a string STR including a program target memory cell transistor MT into which electrons are not injected will be referred to as a program inhibition string STR(i), and a bit line BL connected to the program inhibition string STR(i) will be referred to as a program inhibition bit line BL(i).

The verification refers to determination of if a threshold voltage of a program target memory cell transistor MT reaches a desired state by reading data from the selected memory cell transistor MT. When the threshold voltage of the selected memory cell transistor MT reaches the desired state, this will be referred to as "passing verification", and when the threshold voltage does not reach the desired state, this will be referred to as "failing in verification".

Figure 5:
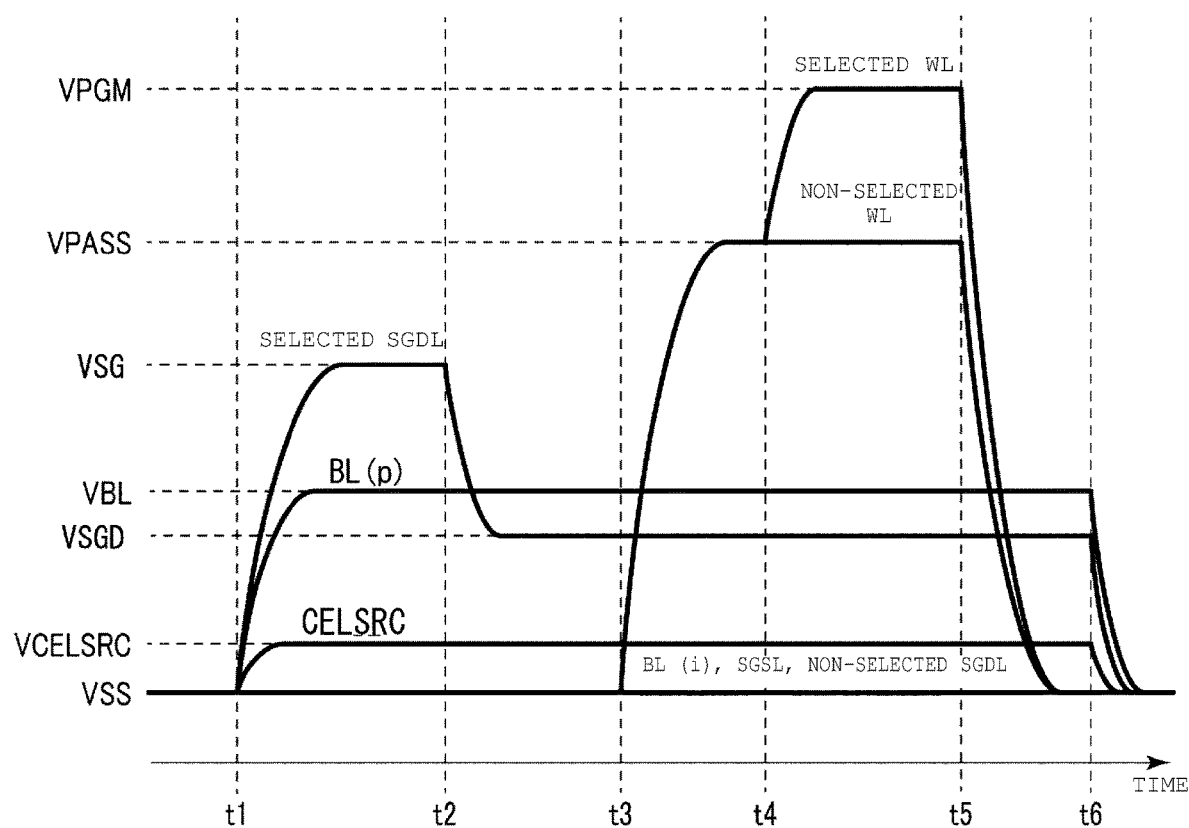
FIG. 5 is a graph illustrating voltages applied to several lines during programming over time in the first embodiment.

FIG. 5 illustrates voltages applied to several lines during programming over time in the first embodiment, and illustrates voltages during programming in a single program loop. Hereinafter, in some cases, a write target cell unit CU will be referred to as a selected cell unit CU, a word line WL connected to the selected cell unit CU will be referred to as a selected word line WL, and a memory cell transistor MT connected to the selected word line WL will be referred to as a selected memory cell transistor MT. In some cases, the word lines WL other than the selected word line WL will be referred to as non-selected word lines WL, and memory cell transistors MT connected to the non-selected word lines WL will be referred to as non-selected memory cell transistors MT.

As illustrated in FIG. 5, at time t1, the sequencer 13 applies a voltage VSS to all illustrated lines.

The sequencer 13 applies a voltage VSG to the select gate line SGDL (illustrated as "selected SGDL" in FIG. 5) of a write target string unit (also referred to as a "selected string unit") SU. The voltage VSG has a magnitude sufficient to cause the selection gate transistor DT to be turned on. As a result, the selection gate transistor DT is turned on in the selected string unit SU. On the other hand, the sequencer 13 continuously applies the voltage VSS to the select gate lines SGDL (illustrated as "non-selected SGDL" in FIG. 5) of non-selected string units SU. The sequencer 13 continuously applies the voltage VSS to the select gate line SGSL from time t1. From time t1, the sequencer 13 applies a voltage VCELSRC to the source line CELSRC, and applies a voltage VBL to a programmable bit line BL(p).

From time t2, the sequencer 13 applies a voltage VSGD to the select gate line SGDL of the selected string unit SU. The voltage VSGD is lower than the voltage VSG and the voltage VBL, and has a magnitude sufficient to cause the selection gate transistor DT in a programmable string STRU(p) to be maintained in an ON state, and cause the selection gate transistor DT in a program inhibition string STR(pi) to be turned off. As a result of the voltage VSGD being applied, a channel of the program inhibition string STR(i) is disconnected from a corresponding program inhibition bit line BL(i), and thus electrically floats.

From time t3, the sequencer 13 applies a voltage VPASS to all of the word lines WL. The voltage VPASS is low enough to prevent data from being erroneously written into the non-selected word lines WL in the programmable string STR(p), and is high enough to prevent a threshold voltage of the selected memory cell transistor MT connected to the selected word line WL from being increased in the program inhibition string STR(i).

From time t4, the sequencer 13 applies a program voltage VPGM to the selected word line WL. The program voltage VPGM is higher than the voltage VPASS. As a result of the program voltage VPGM being applied, a great potential difference based on the program voltage VPGM and the voltage VSS is generated between the selected word line WL and the channel in the programmable string STR(p). As a result, electrons are injected into the charge storage layer of the selected memory cell transistor MT of the programmable string STR(p), and thus a threshold voltage of the selected memory cell transistor MT increases.

On the other hand, from time t4, the sequencer 13 also continuously applies the voltage VPASS to the non-selected word lines WL. The voltage VPASS is sufficiently lower than the program voltage VPGM. Thus, also in the programmable string STR(p), a potential difference based on the voltage VPASS and the voltage VSS between the non-selected word line WL and the channel, is sufficiently smaller than a difference between the program voltage VPGM and the voltage VSS. Thus, a threshold voltage of the non-selected memory cell transistor MT of the programmable string STR(p) is nearly maintained without electrons being almost injected into the charge storage layer.

The program inhibition string STR(i) electrically floats, and thus the channel thereof is coupled to the word line WL, so as to be increased in a voltage due to application of the program voltage VPGM and the voltage VPASS to the word line WL, and thus has a small potential difference with the word line WL. For that reason, electrons are scarcely injected into the charge storage layer of the selected memory cell transistor MT of the program inhibition string STR(i) even if the program voltage VPGM is applied.

From time t5, the sequencer 13 changes voltages of the selected word line WL and the non-selected word lines WL back to the voltage VSS.

From time t6, the sequencer 13 changes voltages of the program inhibition bit line BL(p), the select gate line SGDL of the selected string unit SU, and the source line CELSRC back to the voltage VSS, and finishes the programming.

It is determined whether or not the selected memory cell transistor MT is increased to a threshold voltage corresponding to the desired state through verification after programming. In the above-described way, a program loop is repeatedly executed. A string STR including a memory cell transistor MT which has failed in verification in a certain program loop is also treated as a programmable string STR(p) in the next program loop. On the other hand, a string STR including a memory cell transistor MT which has passed verification in a certain program loop is treated as a program inhibition string STR(i) in the next program loop.

Figure 6:
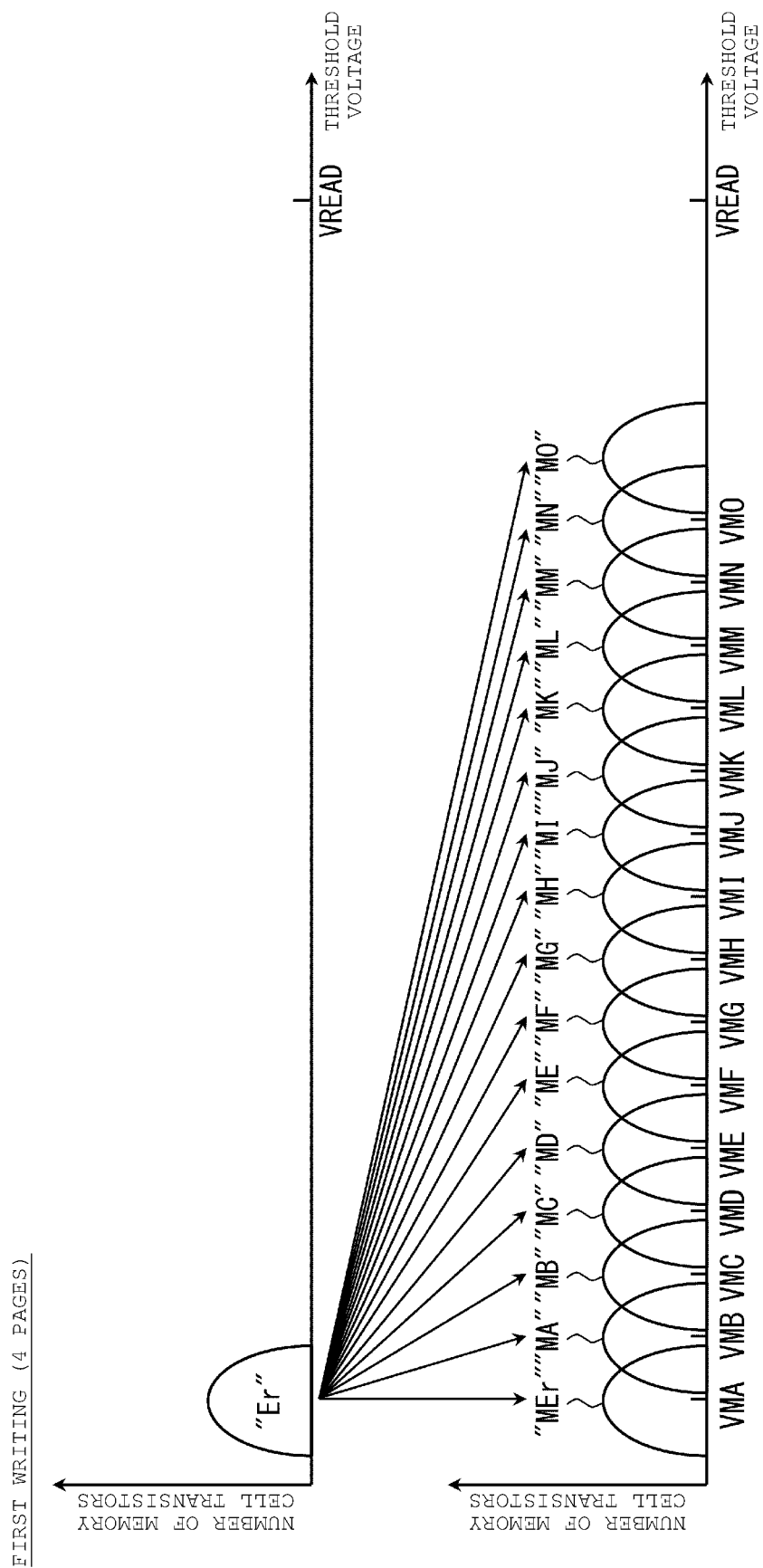
FIG. 6 is a diagram illustrating a change in a threshold voltage distribution of the memory cell transistor due to first writing in the first embodiment.

Next, with reference to FIG. 6, a description will be made of first writing according to the first embodiment. FIG. 6 is a diagram illustrating a change in a threshold voltage distribution of the memory cell transistor MT according to first writing in the first embodiment.

The semiconductor memory 1 receives data of a four-page size from the memory controller 2, and performs first writing. The data of a four-page size is written into a top, upper, middle, and lower pages of the selected cell unit CU, which are respectively referred to as top page data, upper page data, middle page data, and lower page data. The sequencer 13 performs the first writing of the top, upper, middle, and lower page data. The first writing indicates rough writing of increasing a threshold voltage of the memory cell transistor MT in an incomplete form on the basis of data to be written.

The memory cell transistor MT before the first writing is performed is in the Er state. In the first writing, the sequencer 13 uses verification voltages VMA, VMB, VMC, VMD, VME, VMF, VMG, VMH, VMI, VMJ, VMK, VML, VMM, VMN, and VMO for verification. The verification voltages VMA, VMB, VMC, VMD, VME, VMF, VMG, VMH, VMI, VMJ, VMK, VML, VMM, VMN, and VMO are used to verify the memory cell transistor MT subjected to writing in the A, B, C, D, E, F, G, H, I, J, K, L, M, N, and O states, respectively. In other words, for example, the verification voltage VMA is used for verification in the first writing on the memory cell transistor MT subjected to writing in the A state. When the memory cell transistor MT subjected to writing in the A state has a threshold voltage equal to or higher than the verification voltage VMA in the first writing, the memory cell transistor MT passes the verification in the first writing. This is the same for the other states. The verification voltages VMA, VMB, VMC, VMD, VME, VMF, VMG, VMH, VMI, VMJ, VMK, VML, VMM, VMN, and VMO have the following magnitudes.

VMA<VA
VMA<VMB<VB
VMB<VMC<VC
VMC<VMD<VD
VMD<VME<VE
VME<VMF<VF
VMF<VMG<VG
VMG<VMH<VH
VMH<VMI<VI
VMI<VMJ<VJ
VMJ<VMK<VK
VMK<VML<VL
VML<VMM<VM
VMM<VMN<VN
VMN<VMO<VO

According to the first writing, the memory cell transistor MT transitions to any one of MEr, MA, MB, MC, MD, ME, MF, MG, MH, MI, MJ, MK, ML, MM, MN, and MO states. The memory cell transistor MT subjected to writing in the A, B, C, D, E, F, G, H, I, J, K, L, M, N, and O states is brought into the MA, MB, MC, MD, ME, MF, MG, MH, MI, MJ, MK, ML, MM, MN, and MO states, respectively, right after the first writing is completed. The memory cell transistor MT maintained in the Er state is maintained in the MEr state during the first writing.

Figure 7:
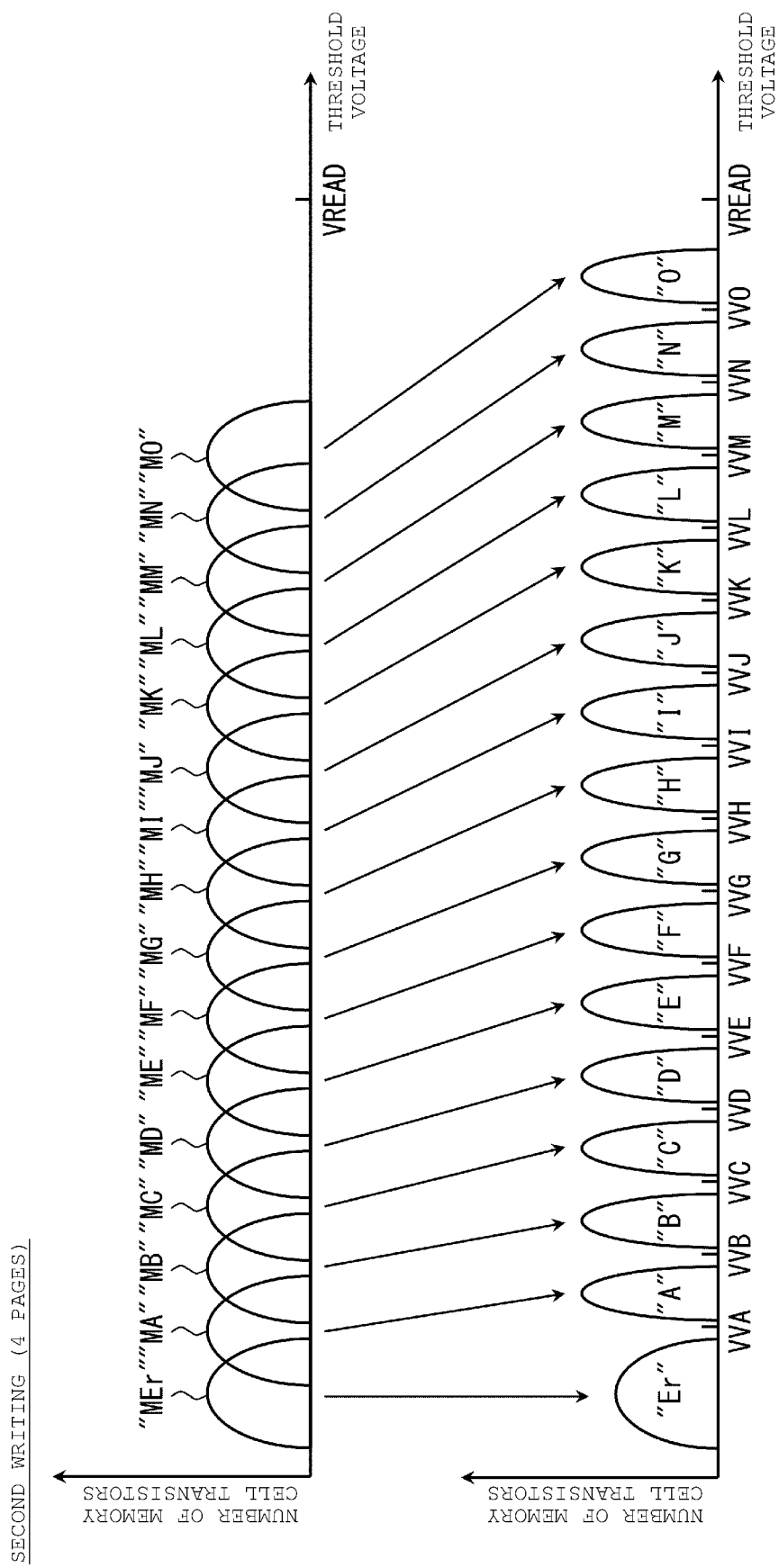
FIG. 7 is a diagram illustrating a change in a threshold voltage distribution of the memory cell transistor due to second writing in the first embodiment.

With reference to FIG. 7, a description will be made of second writing according to the first embodiment. FIG. 7 is a diagram illustrating a change in a threshold voltage distribution of the memory cell transistor MT according to second writing in the first embodiment.

The semiconductor memory 1 receives, from the memory controller 2, data to be written into the selected cell unit CU, that is, the same top page data, upper page data, middle page data, and lower page data as those used in the first writing. The second writing is performed using the received top page data, upper page data, middle page data, and lower page data. The second writing refers to fine writing for completing writing by completing an increase of a threshold voltage of the memory cell transistor MT.

In the second writing, the sequencer 13 uses verification voltages VVA, VVB, VVC, VVD, VVE, VVF, VVG, VVH, VVI, VVJ, VVK, VVL, VVM, VVN, and VVO. The verification voltages VVA, VVB, VVC, VVD, VVE, VVF, VVG, VVH, VVI, VVJ, VVK, VVL, VVM, VVN, and VVO are used to verify the memory cell transistor MT subjected to writing in the A, B, C, D, E, F, G, H, I, J, K, L, M, N, and O states, respectively. In other words, for example, the verification voltage VVA is used for verification in the second writing on the memory cell transistor MT subjected to writing in the A state. When the memory cell transistor MT subjected to writing in the A state has a threshold voltage equal to or higher than the verification voltage VVA in the second writing, the memory cell transistor MT passes the verification in the second writing. This is also the same for the other states. The verification voltages VVA, VVB, VVC, VVD, VVE, VVF, VVG, VVH, VVI, VVJ, VVK, VVL, VVM, VVN, and VVO have the following magnitudes.

VA<VVA<VVB
VB<VVB<VVC
VC<VVC<VVD
VD<VVD<VVE
VE<VVE<VVF
VF<VVF<VVG
VG<VVG<VVH
VH<VVH<VVI
VI<VVI<VVJ
VJ<VVJ<VVK
VK<VVK<VVL
VL<VVL<VVM
VM<VVM<VVN
VN<VVN<VVO
VO<VVO

In one-step writing, a threshold voltage of the memory cell transistor MT transitions to a state on the lower part in FIG. 7 from a state on an upper part in FIG. 6 without passing through a state on the upper part in FIG. 7.

Figure 8:
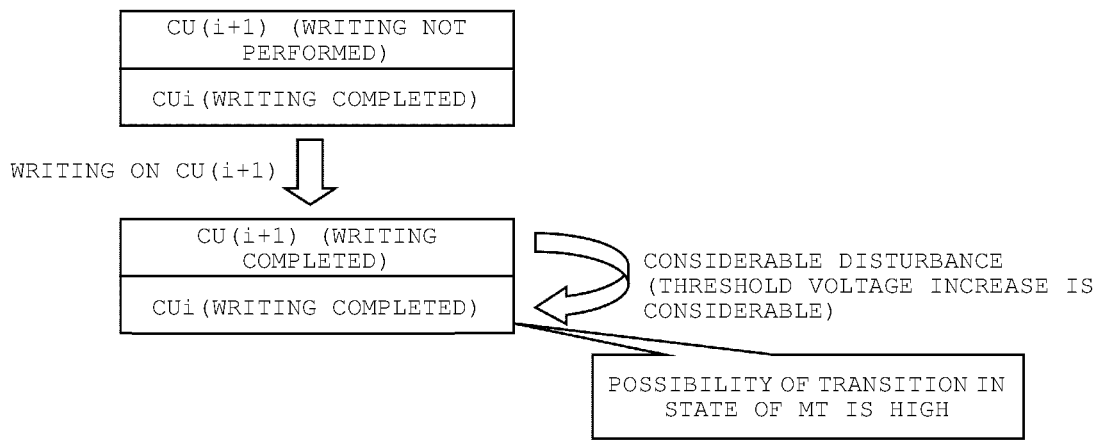
FIG. 8 is a conceptual diagram illustrating transition in a state of a cell unit according to one-step writing.

One of purposes of two-step writing is to prevent a threshold voltage of the memory cell transistor MT of the cell unit CU in which data has been written from unintentionally transitioning to a state different from a desired state due to writing on the cell unit CU continuously adjacent thereto. In other words, in one-step writing, the memory cell transistor MT transitions to a desired state through writing performed once, and the greatest transition is transition from the Er state to the O state having a high threshold voltage. As illustrated in FIG. 8, when one-step writing is performed on a cell unit CU(i+1) after writing on a cell unit CUi (where i is 0 or a natural number) is performed, a threshold voltage of the memory cell transistor MT of the cell unit CUi may be unintentionally increased due to an increase of a threshold voltage of the memory cell transistor MT of the cell unit CU(i+1). This increase is significant enough to have the great influence on the cell unit CUi, that is, a disturbance is significant. As a result, there is concern that the memory cell transistor MT of the cell unit CUi may transition to a state different from an intended state.

Figure 9:
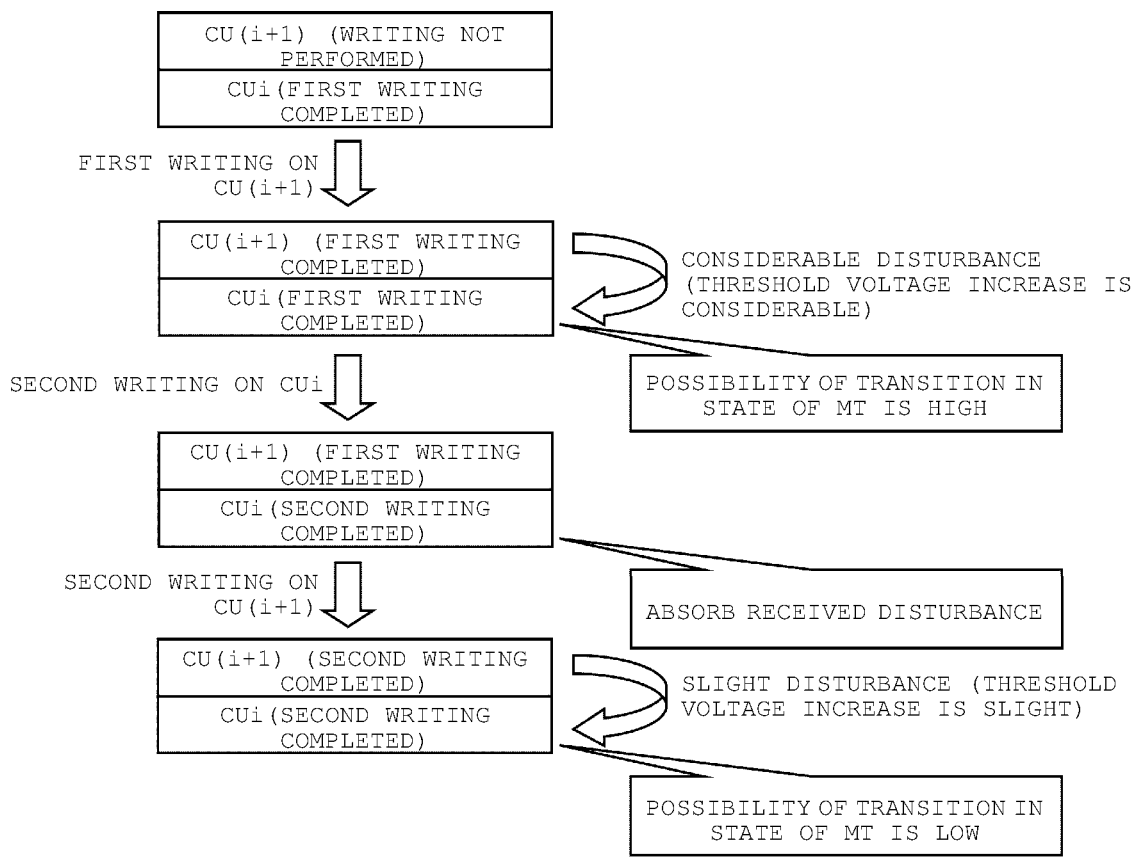
FIG. 9 is a conceptual diagram illustrating transition in a state of a cell unit according to two-step writing in the first embodiment.

In two-step writing, as illustrated in FIG. 9, first writing is performed on the cell unit CUi, and then first writing is performed on the cell unit CU(i+1). In this case, a threshold voltage of the memory cell transistor MT of the cell unit CUi may be increased due to the first writing on the cell unit CU(i+1). However, thereafter, a threshold voltage of the memory cell transistor MT of the cell unit CU(i+1) is controlled to be brought into a desired state due to the second writing on the cell unit CU(i+1), and thus a disturbance caused by the first writing on the cell unit CU(i+1) is offset by the second writing.

The second writing on the cell unit CU(i+1) may apply a disturbance to the cell unit CUi on which the second writing is completed. However, an increase of a threshold voltage due to the second writing is smaller than an increase of a threshold voltage due to the first writing, and thus does not exert the great influence on the cell unit CUi on which writing is completed. Therefore, the memory cell transistor MT of the cell unit CUi is prevented from transitioning unintentionally to another state from a state after writing is completed.

With reference to FIG. 10, a description will be made of data writing according to the first embodiment. FIG. 10 is a table illustrating an order of data writing in a single certain block BLK in the first embodiment. The memory controller 2 instructs first writing and second writing to be performed on a selected cell unit CU as described below with reference to FIG. 10. The sequencer 13 performs the first writing and the second writing for which the instruction is given.

A row including a notation with Y (where Y is 0 or a natural number) indicates information regarding a cell unit CUY. Columns including notations such as SU0, SU1, SU2, and SU3 respectively indicate information regarding the string units SU0, SU1, SU2, and SU3. A number in a cell at an intersection between a row and a column indicates an order of first writing (WT1) and second writing (WT2) being performed on a cell unit CU of a corresponding string unit SU of the cell.

As illustrated in FIG. 10, first, the memory controller 2 performs writing on all of the cell units CU of the string unit SU0. In the string unit SU0, the memory controller 2 first performs first writing on the cell unit CU0 having the minimum address (ID, for example). Next, first writing is second performed on the cell unit CU1 having an ID which is greater by one, and then second writing is performed on the cell unit CU0. Thereafter, writing is performed in an increasing order of IDs of the cell units CU in the same order. In other words, a set of first writing on the cell unit CU(i+1) and second writing on the cell unit CUi is repeatedly performed and i is incremented by 1 each time. Specifically, first writing is performed on the cell unit CU2, and then second writing is performed on the cell unit CU1. The same applies hereinafter.

With respect to each cell unit CU, when second writing on the cell unit CU is completed, the memory controller 2 may discard data with the four-page size written in the cell unit CU. In other words, the region of the RAM 23 in which the four-page size data which is a second writing target may be cleared.

After writing on the string unit SU0 is completed, the memory controller 2 performs the same writing as in the string unit SU0 on the string units SU1, SU2, and SU3 in this order. The writing may not be performed in an increasing order of the IDs of the string units SU. For example, the writing may be performed in a decreasing order of the IDs of the string units SU, and may be performed at random.

FIG. 11 illustrates write data stored in the RAM 23 of the memory controller 2 during writing according to the first embodiment. Each cell in FIG. 11 indicates a region storing data with a page size.

The memory controller 2 is required to store four-page data to be written into each cell unit CU until second writing on the cell unit CU is finished. As illustrated in FIG. 11, a maximum size of data required to be stored is a size of a total of eight pages for two cell units CU during the writing described with reference to FIG. 10 or the like. In other words, data with the four-page size to be written into the cell unit CU1 and data with the four-page size to be written into the cell unit CU0 are required to be stored in preparation for uncompleted second writing which is third performed on the cell unit CU0, during first writing which is second performed on the cell unit CU1 in FIG. 10. When second writing which is third performed on the cell unit CU0 is completed, write data for the cell unit CU0 is not necessary, and, instead, the memory controller 2 is required to store four-page size data for first writing on the cell unit CU2.

As mentioned above, write data for the cell unit CUi, and write data for the cell unit CU(i−1) for second writing on the subsequent cell unit CU(i−1) are required to be stored, during first writing on the cell unit CUi. Write data for the cell unit CUi and write data for the subsequent cell unit CU(i+1) are required to be stored during second writing on the cell unit CUi.

Therefore, a size of data required to be stored in any stage is a size of eight pages.

1.3 Effect

According to the first embodiment, as will be described below, a size of data stored in the RAM 23 of the memory controller 2 during writing of data into the semiconductor memory 1 can be reduced compared with a case illustrated in FIG. 13.

In the memory system 5 of the first embodiment, to improve write performance, two-step writing may be performed in an order as illustrated in FIG. 12. FIG. 12 illustrates an order of data writing in a reference example in the same form as that in FIG. 10. As illustrated in FIG. 12, in respective cases where k (where k is 0 or a natural number) is 0 to 3, a set of first writing on the cell unit CUi of a string unit SUk in an increasing order of k, a set of first writing on the cell unit CU(i+1) of the string unit SUk in an increasing order of k, and a set of second writing on the cell unit CUi of the string unit SUk in an increasing order of k are performed. The set of first writing on the cell unit CUi of the string unit SUk in the increasing order of k, the set of first writing on the cell unit CU(i+1) of the string unit SUk in the increasing order of k, and the set of second writing on the cell unit CUi of the string unit SUk in the increasing order of k are repeatedly performed while i is incremented by 1.

In the writing method illustrated in FIG. 12, four-page data for each of two cell units CUi and CU(i+1) of each of the string units SU0 to SU3 is required to be stored in the memory controller 2 during writing as illustrated in FIG. 13. In other words, data of 16 pages=the number of string units (=4)× the number of cell units (=2)× the number of pages (=2) is required to be stored. This requires the memory controller 2 to have the RAM 23 with a considerably large capacity.

A large amount of page data is required to be stored, and thus a large emergency power source is required to be provided. When the supply of power from the host apparatus 3 is suddenly stopped, the memory controller 2 is required to write data to be written on the RAM 23 into the semiconductor memory 1. To do so, the memory controller 2 has an emergency power source, and uses the emergency power source to write the data to be written on the RAM 23 into the semiconductor memory 1 when the supply of power is suddenly stopped. When a size of the data to be written, stored in the RAM 23, is large, the emergency power source is required to have a large capacity in order to reliably write the data during the supply of power from the emergency power source.

According to the first embodiment, a set of first writing on the cell unit CU(i+1) and second writing on the cell unit CUi is repeatedly performed on a single string unit SU and i is incremented by 1 each time. When writing on the single string unit SU is completed, writing transitions to another string unit SU. Thus, a maximum size of data required to be stored during writing is a size of a total of eight pages. Therefore, a necessary capacity of the RAM 23 is smaller than that in the reference example. For the same reason, a necessary capacity of the emergency power source in the first embodiment is smaller than that in the reference example.

Second Embodiment

A second embodiment is different from the first embodiment in terms of a writing method.

A memory system 5 according to the second embodiment has the same elements and connection therebetween as those of the memory system 5 according to the first embodiment. On the other hand, a memory controller 2 according to the second embodiment is configured to perform operations described below, and, specifically, firmware in a ROM 24 is configured to cause the memory controller 2 to perform operations described below. Hereinafter, differences from the first embodiment will be focused.

In the second embodiment, both of two-step writing and one-step writing are used. However, the one-step writing is used for writing of data with below four pages per cell unit CU. The one-step writing includes repetition of a plurality of program loops in the same manner as in first writing and second writing. In the one-step writing, each memory cell transistor MT transitions to a desired state without passing through an intermediate state which is obtained through first writing in two-step writing.

Figure 14:
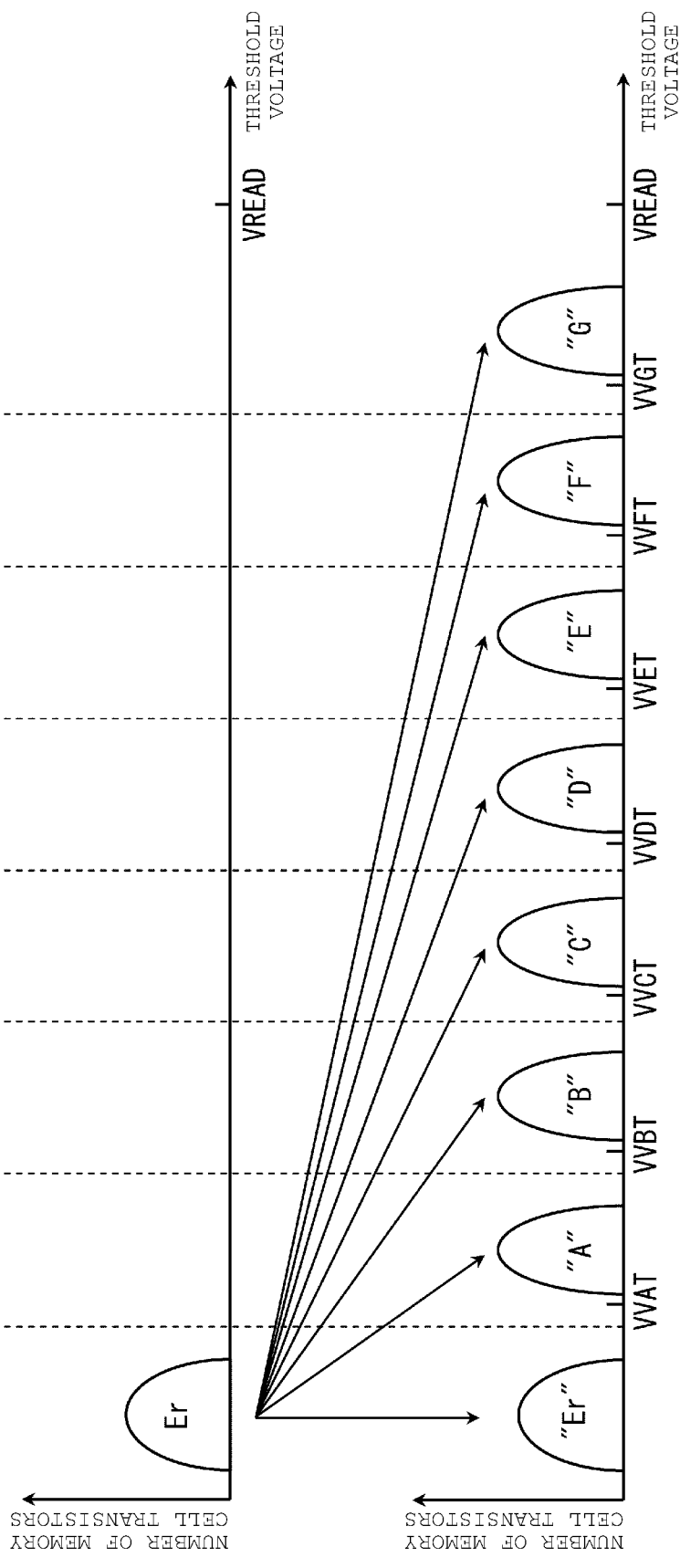
FIG. 14 is a diagram illustrating a change in a threshold voltage distribution of a memory cell transistor according to one-step writing in a second embodiment.

FIG. 14 illustrates a change in a threshold voltage distribution of the memory cell transistor MT due to one-step writing in the second embodiment. FIG. 14 illustrates an example of writing of data of three pages per cell unit CU. When writing of three pages, each memory cell transistor MT may have any one of eight threshold voltages. The eight threshold voltages are in states of storing data of "111", data of "110", data of "100", data of "000", data of data of "010", data of "011", data of "001", and data of "101", respectively. The memory cell transistor MT in states of storing data of "111", data of "110", data of "100", data of "000", data of "010", data of "011", data of "001", and data of "101", will be referred to as being in Er, A, B, C, D, E, F, and G states, respectively. The memory cell transistor MT in the Er state, the A state, the B state, the C state, the D state, the E state, the F state, and the G state has a higher threshold voltage in this order.

The Er, A, B, C, D, E, F, and G states when writing of three pages are different from the Er, A, B, C, D, E, F, and G states when writing of four pages. In other words, when writing of three pages, the sequencer 13 uses verification voltages VVAT, VVBT, VVCT, VVDT, VVET, VVFT, and VVGT. The verification voltages VVAT, VVBT, VVCT, VVDT, VVET, VVFT, and VVGT are used to verify the memory cell transistor MT subjected to writing in the A, B, C, D, E, F, and G states, respectively.

A set of data of bits at an identical position (that is, a digit) of the memory cell transistors MT of a single cell unit CU configures a single page. A set of data of the most significant (that is, the first digit) bits of the memory cell transistors MT of each cell unit CU will be referred to as an upper page. A set of data of bits in the second digit from the most significant bits of the memory cell transistors MT of each cell unit CU will be referred to as a middle page. A set of data of the least significant (that is, the third digit) bits of the memory cell transistors MT of each cell unit CU will be referred to as a lower page.

As can be seen through comparison between FIG. 14 and FIG. 7, as the number of pages written in each cell unit CU becomes smaller, a gap of a threshold voltage distribution becomes wider, and thus a constraint imposed on a shape of the threshold voltage distribution becomes less severe.

Figures 17, 18:
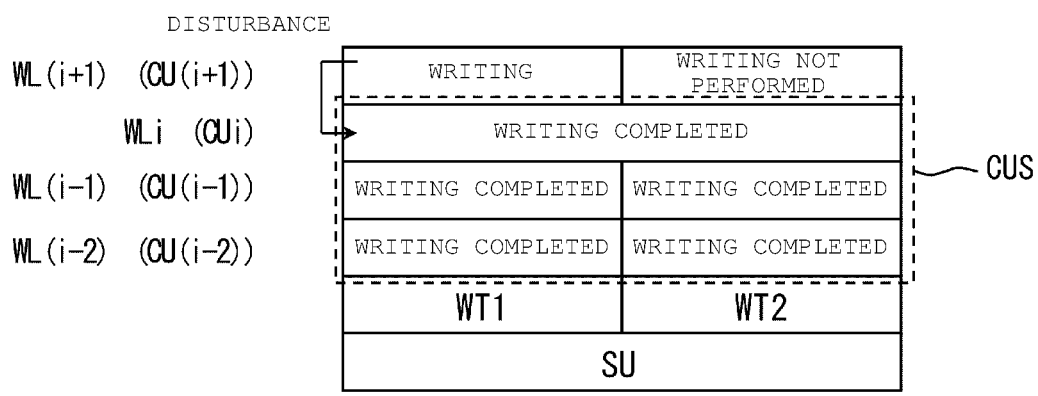
FIG. 17 is a table illustrating a data writing method according to the second embodiment.
FIG. 18 is a conceptual diagram illustrating a certain state during first unit writing in the second embodiment.

With reference to FIGS. 15 to 17, a description will be made of data writing according to the second embodiment. FIG. 15 illustrates a cell unit set in the second embodiment. The memory controller 2 performs writing by using a cell unit set CUS illustrated in FIG. 15. As illustrated in FIG. 15, the cell unit set CUS includes w cell units CU which are continuously located in an increasing order of IDs. FIG. 15 and the following description are based on an example in which w is 3.

FIGS. 16 and 17 illustrate a data writing method according to the second embodiment in the same form as that in FIG. 10 of the first embodiment. As will be described below with reference to FIGS. 16 and 17, the memory controller 2 provides an instruction for first writing, second writing, and one-step writing for three pages on a selected cell unit CU of the cell unit set CUS. The sequencer 13 performs the first writing, the second writing, and the one-step writing designated in the instruction order.

As illustrated in FIGS. 16 and 17, the memory controller 2 performs writing for each cell unit set CUS on a plurality of string units SU in an increasing order of the IDs of the string units SU. Then, the memory controller 2 performs writing in an increasing order for the string units SU of each cell unit set CUS, on the next cell unit set CUS. Specifically, the writing is performed as follows.

The memory controller 2 performs writing on the cell units CU0, CU1, and CU2 of the string unit SU0 with the smallest ID. More specifically, in the string unit SU0, first writing on the cell unit CU0, first writing on the cell unit CU1, and second writing on the cell unit CU0 are performed. Next, the memory controller 2 performs one-step writing for below four pages on the cell unit CU2. In other words, the memory controller 2 performs, for example, one-step writing for three pages as illustrated in FIG. 14 on the cell unit CU2. Next, the memory controller 2 performs second writing on the cell unit CU1. As a result, writing on a single cell unit set CUS of a single string unit SU completes. Hereinafter, writing on the cell unit set CUS of a single string unit SU will be referred to as first unit writing (illustrated as 1UWT in FIG. 17).

The first unit writing is characterized by the following general description. In other words, the first unit writing refers to first writing on a cell unit CUi, first writing on a cell unit CU(i+1), second writing on the cell unit CUi, one-step writing on a cell unit CU(i+2), and second writing on the cell unit CU(i+1) in this order.

Next, the memory controller 2 performs first writing on the cell units CU0, CU1, and CU2 having the same IDs as the IDs of the three cell units CU of the cell unit set CUS having undergone writing in the string unit SU0, on the next string unit SU1. Similarly, the memory controller 2 performs first writing on the cell units CU0, CU1, and CU2 having the same IDs as the IDs of the three cell units CU of the cell unit set CUS having undergone writing in the string unit SU0, on the next string unit SU2. Similarly, the memory controller 2 performs first writing on the cell units CU0, CU1, and CU2 having the same IDs as the IDs of the three cell units CU of the cell unit set CUS having undergone writing in the string unit SU0, on the next string unit SU3. In the above-described way, the first unit writing on the same set of the cell units CU0, CU1, and CU2 is performed with respect to all of the string units SU. Such a set of the first unit writing will be referred to as second unit writing (illustrated as 2UWT in FIG. 17).

The second unit writing is characterized by the following general description. In other words, the second unit writing refers to first unit writing on the string unit SU0 at i, i+1, and i+2, first unit writing on the string unit SU1 at i, i+1, and i+2, first unit writing on the string unit SU2 at i, i+1, and i+2, and first unit writing on the string unit SU3 at i, i+1, and i+2 that are performed in this order.

Next, the memory controller 2 performs second unit writing on the next cell unit set CUS including the cell units CU3, CU4, and CU5. Similarly, the memory controller 2 performs second unit writing on the further next cell unit set CUS. In the above-described way, the second unit writing is performed in an increasing order of the IDs of the cell units CU. It is noted that, in FIGS. 16 and 17 and this example, the cell unit CU7 is a cell unit CU having the greatest ID, and second unit writing which is third performed is not performed. Alternatively, when a set of three cell units is not made, the memory controller 2 performs third unit writing (illustrated as 3UWT in FIG. 17) on a last set of cell units CU (for example, the cell units CU6 and CU7) not subjected to writing in each string unit SU in an increasing order of the string units SU.

The third unit writing refers to an operation where when two cell units CU are not subjected to writing as illustrated in FIGS. 16 and 17, first writing on a cell unit CUi, first writing on a cell unit CU(i+1), second writing on the cell unit CUi, and second writing on the cell unit CU(i+1) are performed in this order.

When a single cell unit CU is not subjected to writing, the third unit writing may be one-step writing. The third unit writing is performed on all of the string units SU, thereby the writing completes.

As can be seen from FIG. 17, cell units CU having IDs greater than IDs of three cell units CU which are second unit writing targets are not subjected to writing during certain second unit writing. For example, during second writing on the cell units CU0, CU1, and CU2, the cell units CU3 to CU7 are not subjected to writing.

A maximum size of data required to be stored in the memory controller 2 is a size of a total of eight pages for two cell units CU during writing in the same manner as in the first embodiment (FIG. 11). In other words, write data for the cell unit CUi, and write data for the cell unit CU(i−1) for second writing on the subsequent cell unit CU(i−1) are required to be stored during first writing on the cell unit CUi.

Write data for the cell unit CUi and write data for the subsequent cell unit CU(i+2) are required to be stored during second writing on the cell unit CUi. Only write data for the cell unit CU(i−1) for second writing on the cell unit CU(i−1) needs to be stored during one-step writing on the cell unit CUi.

The description hitherto relates to an example in which the cell unit set CUS, which is a first unit writing target, includes three cell units CU. However, the cell unit set CUS may include four or more cell units CU. In other words, first unit writing is performed on w cell units, the description hitherto relates to an example of w=3, and w may be 4 or greater. Different w may be used in different second unit writing 2UWT.

Figure 19:
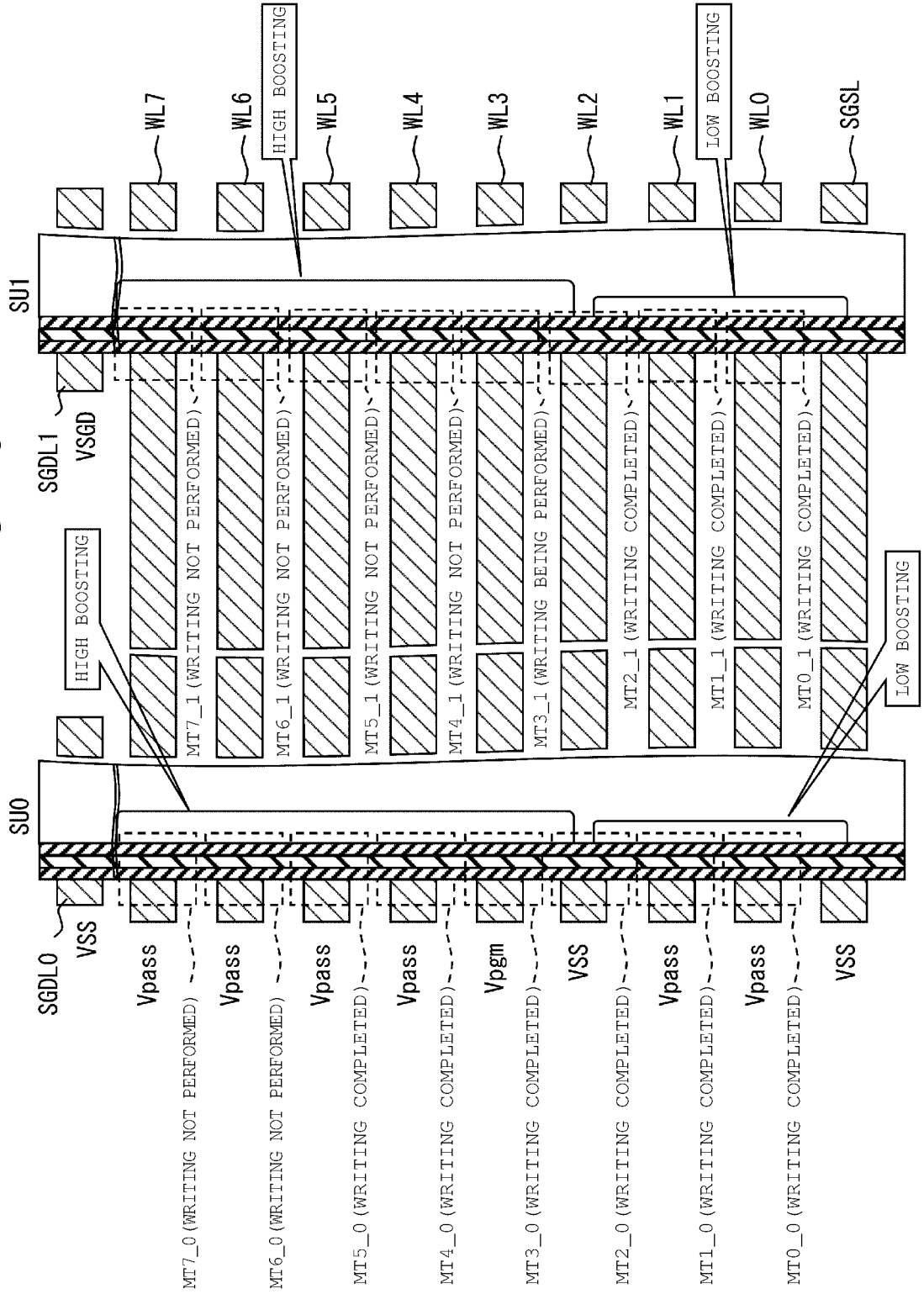
FIG. 19 is a cross-sectional diagram illustrating a certain state of a single string during writing according to the second embodiment.
Figure 20:
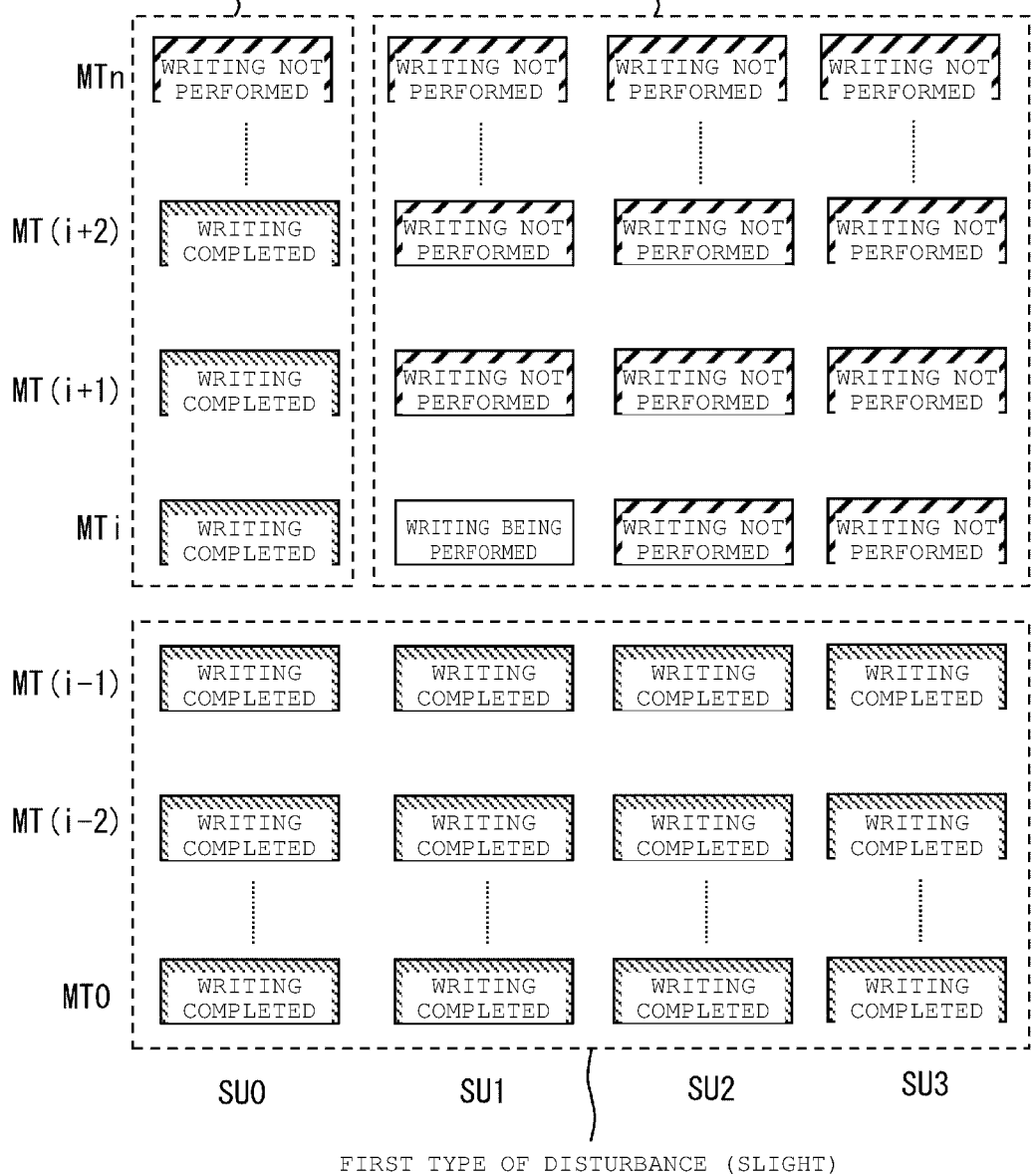
FIG. 20 is a conceptual diagram illustrating disturbance types which may occur in the second embodiment.

With reference to FIGS. 18 to 20, a description will be made of a state during writing according to the second embodiment. FIG. 18 illustrates a state during first unit writing according to the second embodiment. FIG. 19 illustrates a state of a single string STR during writing according to the second embodiment, and illustrates a state for a part of FIG. 3. FIGS. 18 and 19 illustrate an example in which first unit writing is performed on three cell units CU (that is, w=3), in other words, the cell unit set CUS includes three cell units CU. FIG. 20 illustrates the types of disturbances which may occur in the second embodiment.

As illustrated in FIG. 18, writing on a cell unit CU (CUi) having the greatest ID in the cell unit set CUS is completed before first writing on a cell unit CU (CU(i+1)) having an ID which is greater by one is performed. Thus, the cell unit CUi may receive a disturbance due to first writing on the cell unit CU(i+1). However, data of below four pages is written in the cell unit CUi, and a constraint imposed on a shape of a threshold voltage distribution is less severe than when data of four pages is written. Therefore, even if a threshold voltage of the memory cell transistor MT of the cell unit CUi is increased due to the disturbance, a state of the memory cell transistor MT of which the threshold voltage is increased is prevented from being changed to other states. In other words, wrong writing on the cell unit CUi is suppressed.

FIG. 19 illustrates an example of n=7 in the same manner as in FIG. 2. In FIG. 19 and the following description, when a memory cell transistor MTZ (where Z is 0 or a natural number) of the string unit SU0 is differentiated from a memory cell transistor MTZ of the string unit SU1, the memory cell transistors MTZ will be respectively referred to as MTZ_0 and MTZ_1. A set of memory cell transistors MT which includes a write target memory cell transistor MTZ and are first unit writing targets will be referred to as a memory cell transistor set.

FIG. 19 illustrates a state during first unit writing on the string unit SU1 in second unit writing on a memory cell transistor set including the memory cell transistors MT3, MT4, and MT5. Particularly, FIG. 19 illustrates a state during writing on a memory cell transistor MT3_1 of the string unit SU1. In other words, first unit writing on the memory cell transistors MT3_0, MT4_0, and MT5_0 is completed. Hereinafter, in a description using FIG. 19, even when "first unit writing" is simply mentioned, the first unit writing refers to first unit writing in currently performed second unit writing.

As illustrated in FIG. 19, writing on the memory cell transistors MT0, MT1, and MT2 of all of the string units SU are completed at the time of writing on the memory cell transistor MT3_1. In the memory cell transistors MT3, MT4, and MT5, which are targets of currently performed second unit writing, data has been written in the memory cell transistors MT3, MT4, and MT5 of all of the string units SU having undergone first unit writing. In this example, writing on the memory cell transistors MT3_0, MT4_0, and MT5_0 is completed.

On the other hand, all memory cell transistors MT having IDs greater than the ID of the memory cell transistor MT5 of the string unit SU0 having undergone first unit writing, that is, the memory cell transistors MT6_0 and MT7_0 are not subjected to writing. In the string unit SU1 on which first unit writing is being performed, all memory cell transistors MT having IDs greater than the memory cell transistor MT3_1 on which writing is being performed, that is, the memory cell transistors MT4_1, MT5_1, MT6_1, and MT7_1 are not subjected to writing. In the string unit SU before being subjected to first unit writing, the memory cell transistors MT4 to MT7 having IDs greater than that of the memory cell transistor MT3 are not subjected to writing.

During writing on the memory cell transistor MT3_1, the program voltage VPGM is applied to the word line WL3, the voltage VSS(=0 V) is applied to the word line WL2, and the voltage VPASS is applied to the rest of the word lines WL. The program voltage VPGM is a high voltage for injecting electrons into the program target memory cell transistor (that is, the selected memory cell transistor) MT. The voltage VPASS has a magnitude sufficient to cause a potential of the channel of the non-selected memory cell transistor MT to be increased to the extent at which the same amount of electrons as when the program voltage VPGM is applied to the charge storage layer CA of the non-selected memory cell transistor MT not subjected to writing is not injected.

Potentials of the channels of the memory cell transistors MT0 to MT7 are boosted due to application of the voltage VPASS. Three different types of disturbances (hereinafter, referred to as non-selection voltage disturbances) may occur depending on a difference in the degree of boost.

As illustrated in FIGS. 19 and 20, the first type of non-selection voltage disturbance may occur in the memory cell transistors MT0, MT1, and MT2 having undergone second unit writing. Since electrons are injected in the charge storage layer of the non-selected memory cell transistor MT having undergone writing, a potential of the channel of the non-selected memory cell transistor MT having undergone writing is not sufficiently boosted. In this example, since the memory cell transistors MT0 and MT1 of all the string units SU have undergone writing, potentials of the channels of the memory cell transistors MT0 and MT1 are not sufficiently boosted. However, since the memory cell transistor MT2 is turned off, the channels of the memory cell transistors MT0 and MT1 are electrically disconnected from the bit line BL. Therefore, in any string unit SU, electrons are not injected into the charge storage layers of the memory cell transistors MT0 and MT1. The voltage VSS is applied to the memory cell transistor MT2, and thus electrons are not injected thereinto. Therefore, disturbances on the memory cell transistors MT0 to MT(i−1) are sufficiently prevented to the intended extent during writing on the memory cell transistor MTi.

The second type of non-selection voltage disturbance may occur in the memory cell transistor MT not subjected to writing of the string unit SU on which first unit writing is not completed. When the voltage VPASS is applied, since electrons are not injected in the charge storage layer of the non-selected memory cell transistor MT not subjected to writing, a potential of the channel of the memory cell transistor MT is sufficiently boosted, and thus electrons are scarcely injected into the memory cell transistor MT. In other words, a non-selection voltage disturbance on the memory cell transistor MT is sufficiently prevented to the intended extent. In this example, in any string unit SU other than the string unit SU0 on which first unit writing is completed, the memory cell transistors MT4 to MT7 having the IDs greater than the ID of the write target memory cell transistor MT3 are not subjected to writing, and thus scarcely receive non-selection voltage disturbances. In other words, in all the string units SU on which first unit writing is not completed, disturbances on memory cell transistor MT(i+1) to MTn are sufficiently prevented during writing on a memory cell transistor MTi.

The third type of non-selection voltage disturbance may occur in memory cell transistors MT (for example, MT4 to MT7) having IDs greater than the ID of the memory cell transistor MT3 on which writing is being performed in a string unit SU (for example, SU0) on which first unit writing is completed. In the string unit SU0, writing on the non-selected memory cell transistors MT4_0 and MT5_0 is completed, and thus potentials of the channels of the non-selected memory cell transistors MT4_0 and MT5_0 are not sufficiently increased. Potentials of the channels of the memory cell transistors MT4 to MTn (=MT7) have an average value of the potentials of the respective channels of the memory cell transistors MT4 to MTn. Thus, the potentials of the channels of the memory cell transistors MT4 to MTn of the string unit SU0 are lower than potentials of the channels of the memory cell transistors MT4 to MTn of a string unit SU (for example, SU1) on which first writing is not completed. An average of the potentials of the channels of the memory cell transistors MT4 to MTn depend on the number of memory cell transistors MT on which writing is completed among the memory cell transistors MT4 to MTn. Thus, the average of the potentials of the channels of the memory cell transistors MT4 to MTn is increased as the number thereof becomes smaller. In each string unit SU on which first unit writing is completed, the maximum number of memory cell transistors MT on which writing is completed in the memory cell transistors MT4 to MTn is a value obtained by subtracting one from the number of memory cell transistors MT of the memory cell transistor set (=w), and is 2 in this example. Thus, potentials of the channels of the memory cell transistors MT4 to MTn of the string unit SU0 are slightly lower than potentials of the channels of the memory cell transistors MT4 to MTn of the string unit SU1. In other words, in all the string units SU on which first unit writing is completed, disturbances on memory cell transistor MT(i+1) to MTn are sufficiently prevented during writing on a memory cell transistor MTi.

Programming is performed on the memory cell transistor MT3_1 according to an increase of a potential of a channel described above, and thus increases of threshold voltages of other memory cell transistors MT are sufficiently prevented.

According to the second embodiment, as will be described below, an amount of data required to be stored in the memory controller 2 during writing is small, and high writing performance can be achieved.

First, according to the second embodiment, in the cell unit set CUS including w (where w is a natural number) cell units CUi, . . . , and CU(i+w), first unit writing including two-step writing on the cell units CU other than the cell unit CU(i+w) and one-step writing on the cell unit CU(i+w) is performed. Since two-step writing is not performed on the cell unit CU(i+w), writing (that is, first writing) on the cell unit CU(i+w+1) is not required to be performed before writing on the cell unit CU(i+w) is completed. Thus, writing in each cell unit set CUS is not required to be continuously performed in an order of IDs of the cell units CU in a certain string unit SU, and first unit writing may be performed on another string unit SU after first unit writing on the cell unit set CUS is completed. Thus, data is not written into cell units CU(i+w+1) to CUn in any string unit SU on which first unit writing in currently performed second unit writing is not completed, except for the time of second writing on the cell unit CU(i+w−1). Therefore, a disturbance due to application of the voltage VPASS to the cell unit CU having undergone writing is less likely to occur in the string unit SU on which first unit writing is not completed, by performing writing on the cell unit CUi.

The maximum number of cell units CU on which writing is completed is two among the cell units CU(i+w+1) to CUn in any string unit SU on which first unit writing in currently performed second unit writing is completed. Thus, potentials of channels of the cell units CU(i+w+1) to CUn are prevented from being reduced more than potentials of channels of the cell units CU(i+w+1) to CUn not including a cell unit CU having undergone writing in a string unit SU on which first unit writing is completed. Therefore, disturbance (that is, the second type of non-selection voltage disturbance) due to application of the voltage VPASS to the cell unit CU(i+w+1) to CUn in any string unit SU on which first unit writing in currently performed second unit writing is completed. Therefore, wrong writing caused by application of the voltage VPASS to a cell unit CU having undergone writing can be prevented.

Second writing on the cell unit CU(i+w−1) may cause a disturbance to the cell unit CU(i+w) having undergone writing. However, since data of below four pages is written in the cell unit CU(i+w), even if a threshold voltage of the memory cell transistor MT of the cell unit CU(i+w) is increased, a change of a state of the memory cell transistor MT to another state is less likely to occur.

According to the second embodiment, wrong writing is prevented as described hitherto, and, the maximum size of data required to be stored during writing is a size of a total of eight pages as described with reference to FIG. 11. Therefore, a necessary capacity of the RAM 23 is smaller than that in the reference example (refer to FIG. 13). Thus, according to the second embodiment, it is possible to achieve both of a reduction of an amount of data required to be stored in the memory controller 2 during writing and high writing performance.

Third Embodiment

A third embodiment is different from the second embodiment in terms of a writing method.

A memory system 5 according to the third embodiment has the same elements and connection therebetween as those of the memory system 5 according to the first embodiment. On the other hand, a memory controller 2 according to the third embodiment is configured to perform operations described below, and, specifically, firmware in a ROM 24 is configured to cause the memory controller 2 to perform operations described below. The third embodiment is similar to the second embodiment. Hereinafter, differences from the second embodiment will be focused.

For example, one or a plurality of cell units CU are not used to store data for the structural reason. The third embodiment relates to such an example, and is based on the second embodiment.

In the third embodiment, the number of word lines WL is 17 (that is, n is 16). However, one word line WL thereof is a dummy word line WL (also indicated by DWL), and word lines WL0 to WL15 are used to write data. The dummy word line WL is located between the word lines WL7 and WL8. In each string unit SU, data is not written into the cell unit CU connected to the dummy word line DWL. Data is written into the cell units CU0 to CU15 connected to the word lines WL0 to WL15, respectively.

Figure 21:
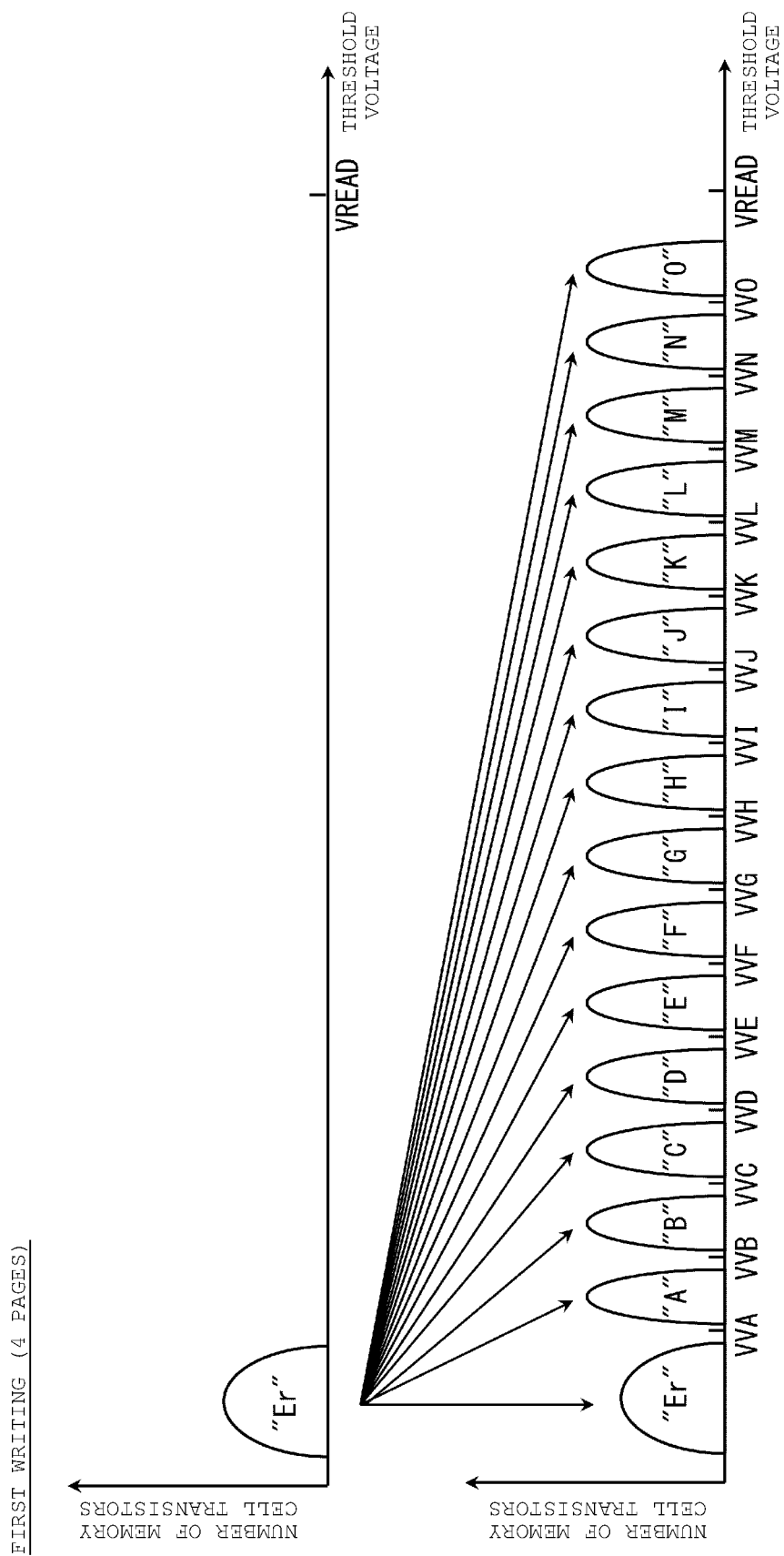
FIG. 21 is a diagram illustrating a change in a threshold voltage distribution of a memory cell transistor according to one-step writing in a third embodiment.

FIG. 21 illustrates a change of a threshold voltage distribution of the memory cell transistor MT due to one-step writing according to the third embodiment. FIG. 21 illustrates an example of writing of data of four pages per cell unit CU. Transition to a desired state occurs without passing through the intermediate state as illustrated on the lower part in FIG. 7 through one step unlike two-step writing (for example, FIGS. 6 and 7) of four pages.

FIG. 22 illustrates a data writing method according to the third embodiment in the same form as that in FIG. 10 in the first embodiment. In the same manner as in the second embodiment, the memory controller 2 repeatedly performs the first unit writing 1UWT on different string units SU, so as to perform the second unit writing 2UWT, and repeatedly performs the second unit writing 2UWT. However, in the third embodiment, the cell unit set CUS, that is, a first unit writing target may be different from that in the second embodiment. This will be described below.

In the first unit writing 1UWT, the memory controller 2 writes data, and also writes four pages through one step into the cell unit CU not having an adjacent cell unit (that is, an upper adjacent cell unit) CU having a greater ID. In this example, four pages are written through one step into the cell unit CU7 connected to the word line WL7 next to the dummy word line DWL. Instead thereof or in addition thereto, the memory controller 2 writes four pages through one step into the cell unit CU15 connected to the word line WL15 having the greatest ID. In other words, one-step writing of four pages in first unit writing is performed on the cell unit CU not having an upper adjacent cell unit into which the next data is written.

On the other hand, data of below four pages is written through one step into cell units CU (for example, CU3 and CU11) having upper adjacent cell units CU in the same manner as in the second embodiment.

The number of cell units CU in the cell unit set CUS may be determined based on the writing and the number of word lines WL. In this example, each cell unit set CUS includes four cell units CU.

Cell units CU (CU7 and (or) CU15) connected to the dummy word line DWL and(or) the word line WL (that is, WL15) having the greatest ID do not have upper adjacent cell units CU into which data is written after data is written into the cell units CU. Thus, a disturbance caused by writing on an adjacent cell unit CU after data is written into the cell unit CU7 and(or) the cell unit CU15 is less likely to occur. Therefore, four pages may be written into the cell unit CU7 and(or) the cell unit CU15 through one step.

According to the third embodiment, in the same manner as in the second embodiment, in the cell unit set CUS including w (where w is a natural number) cell units CUi, . . . , and CU(i+w), first unit writing including two-step writing on the cell units CU other than the cell unit CU(i+w) and one-step writing on the cell unit CU(i+w) is performed, and then separate first unit writing is performed on another string unit SU. As a result, it is possible to obtain the same advantage as that in the second embodiment.

According to the third embodiment, four pages are written through one step into the cell unit CU not having an upper adjacent cell unit CU in first unit writing. Thus, even if first unit writing is performed, data of the maximum number of pages can be written into the first unit writing target cell unit set CUS as much as possible. Therefore, the memory system 5 having a large capacity can be achieved.

Fourth Embodiment

A fourth embodiment is different from the second embodiment in terms of a writing method.

A memory system 5 according to the fourth embodiment has the same elements and connection therebetween as those of the memory system 5 according to the first embodiment. On the other hand, a memory controller 2 according to the fourth embodiment is configured to perform operations described below, and, specifically, firmware in a ROM 24 is configured to cause the memory controller 2 to perform operations described below. The fourth embodiment is similar to the second embodiment. Hereinafter, differences from the second embodiment will be focused.

FIG. 23 illustrates a data writing method according to the fourth embodiment in the same form as that in FIG. 10 of the first embodiment. FIG. 23 illustrates an example in which cell unit sets CUS of the string units SU0 and SU3 respectively includes eight cell units CU and four cell units CU, and each of cell unit sets CUS of the string units SU1 and SU2 include four cell units CU.

As illustrated in FIG. 23, the memory controller 2 performs first unit writing on the cell unit set CUS including the cell unit CU0 of the string unit SU0. The cell unit set CUS including the four cell units CU (that is, w=4) includes cell units CU0, CU1, CU2, and CU3, and data of below four pages is written into the cell unit CU3 through one step. Hereinafter, writing on layers of the cell units CU0, CU1, CU2, and CU3 are continuously performed. Hereinafter, the cell unit set CUS including the cell units CU0, CU1, CU2, and CU3 will be referred to as a first layer cell unit set CUS.

The memory controller 2 performs first unit writing on the first layer cell unit sets CUS of the string units SU1 and SU2, that is, the cell units CU0, CU1, CU2, and CU3 in an increasing order of addresses of the string units SU in this example.

The memory controller 2 performs first unit writing on the cell unit set CUS including the first layer cell unit set CUS with respect to the string unit SU having the greatest ID, that is, the string unit SU3. First unit writing in the string unit SU3 has w which is different from that in the first unit writing 1UWT in the string units SU0, SU1, and SU2, and will be referred to as first unit writing 1UWT_2. First unit writing at w=4 will be hereinafter referred to as first unit writing 1UWT_1.

Here, w in the first unit writing 1UWT_2 is w (=4) in the first unit writing 1UWT_1×2 (=8). The first unit writing 1UWT_2 in the string unit SU3 is performed on the cell units CU0 to CU7, and data of below four pages is written into the cell unit CU7 through one step.

Next, the memory controller 2 performs first unit writing on a second layer cell unit set CUS including four cell units CU having an ID which is one greater than the ID of the first layer and consecutive IDs, that is, cell units CU4, CU5, CU6, and CU7. Specifically, the memory controller 2 performs the first unit writing 1UWT_1 on the second layer cell unit sets CUS of the string units SU2 and SU1, that is, in a decreasing order of the IDs of the string units SU.

The memory controller 2 performs the first unit writing 1UWT_2 on a cell unit set CUS including the second layer cell unit set CUS in the string unit SU0 having the smallest ID. In other words, in the string unit SU0, the first unit writing 1UWT is performed on the cell units CU4 to CU11, and data of below four pages is written into the cell unit CU11 through one step.

Hereinafter, when writing from the first unit writing 1UWT_1 on the first layer cell unit set CUS in the string unit SU1 to the first unit writing 1UWT_2 in the string unit SU0 is assumed to be one cycle, the next cycle is started from four cell units CU having an ID which is one greater than the ID in the second layer of the string unit SU1 and the consecutive IDs, that is, a third layer cell unit set CUS including the cell units CU8, CU9, CU10, and CU11. Subsequently, an identical cycle is repeated. However, in the word line WL having the greatest ID, that is, in the word line WL15 in this example, there is no upper word line WL, and thus one-step writing of below four pages is not required to be performed. Therefore, data of four pages may be written with respect to the word line WL15 through two steps. In other words, in first unit writing on each layer cell unit set CUS in all of the string units SU, one-step writing of below four pages is not performed in a single string unit SU. The first unit writing 1UWT_2 is performed on the first layer cell unit set CUS and the second layer cell unit set CUS in a single string unit SU in writing on a certain first layer cell unit set CUS.

Figure 24:
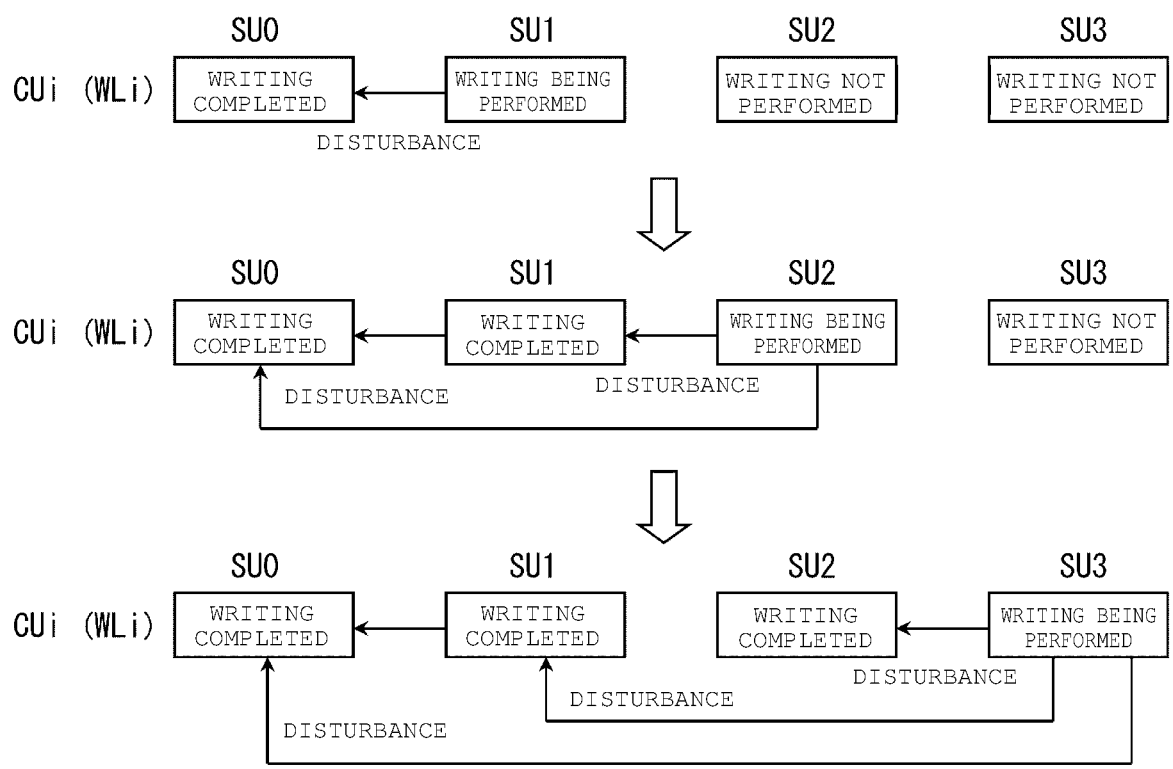
FIG. 24 is a conceptual diagram illustrating disturbances in a memory system according to the fourth embodiment.

FIG. 24 illustrates disturbances in the memory system according to the fourth embodiment. As illustrated in FIG. 24, in first unit writing in a plurality of string units SU for the cell unit set CUS of a certain identical layer, a string unit SU having undergone writing receives a disturbance due to writing on a certain string unit SU. The disturbance is caused by applying, for example, the program voltage VPGM. The string unit SU having undergone writing receives a disturbance when writing is performed on other string units SU. Thus, in an example of four string units SU, a string unit SU on which writing is first performed receives three disturbances. Therefore, when the string units SU are subjected to writing in an identical order in any layer cell unit set CUS, an identical string unit SU receives the maximum disturbance in any layer cell unit set CUS. For example, when the string units SU are subjected to writing in an increasing order of IDs in any layer cell unit set CUS, the string unit SU0 receives the maximum disturbance in any layer cell unit set CUS.

In the fourth embodiment, an order of a string unit SU subjected to writing differs in layers in which cell unit sets CUS are different from each other.

According to the fourth embodiment, in the same manner as in the second embodiment, in the cell unit set CUS including w (where w is a natural number) cell units CUi, . . . , and CU(i+w), first unit writing including two-step writing on the cell units CU other than the cell unit CU(i+w) and one-step writing on the cell unit CU(i+w) is performed, and then separate first unit writing is performed on another string unit SU. For that reason, it is possible to obtain the same advantage as that in the second embodiment.

According to the fourth embodiment, an order of a string unit SU subjected to writing differs in layers in which cell unit sets CUS are different from each other. Thus, string units SU receiving the maximum disturbance are distributed, and thus it is possible to prevent a specific string unit SU from having reliability lower than that of other string units SU.

MODIFICATION EXAMPLES

The fourth embodiment may be combined with the third embodiment. A modification example of the fourth embodiment will be described with reference to FIG. 25. Hereinafter, differences from the fourth embodiment in FIG. 23 will be focused.

In the modification example, the number of word lines WL is 21. One word line WL thereof is a dummy word line DWL, and cell units CU0 to CU19 connected to word lines WL0 to WL15 and word lines WL16 to WL19 are used to write data. The dummy word line WL is located between the word lines WL15 and WL16.

The cell unit CU15 does not have an upper adjacent cell unit into which data is written unlike in FIG. 23 illustrating the fourth embodiment. Thus, the memory controller 2 writes data of four pages through one step into the cell units CU15 of the string units SU0 to SU3 in the same manner as in writing on the cell unit CU7 in FIG. 22 of the third embodiment.

The memory controller 2 also performs one-step writing of four pages on the cell unit CU19 connected to the word line WL (that is, WL19) having the greatest ID.

According to the modification example of the fourth embodiment, it is possible to obtain advantages of both of the fourth embodiment and the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory system comprising:
a storage device including
a first string including a first memory cell transistor and a second memory cell transistor connected in series to each other, and a first select transistor,
a second string including a third memory cell transistor and a second select transistor, a gate of the second select transistor being independent from a gate of the first select transistor; and
a controller configured to perform writing, wherein
the controller
performs first writing to cause a threshold voltage of the first memory cell transistor to be lower than a first target threshold voltage,
performs second writing to cause a threshold voltage of the second memory cell transistor to be higher than a second target threshold voltage after the first writing,
performs third writing to cause a threshold voltage of the first memory cell transistor to be higher than the first target threshold voltage after the second writing, and
performs fourth writing on the third memory cell transistor after the third writing,
wherein the storage device further includes a fourth memory cell transistor located between the third memory cell transistor and the first select transistor, and
wherein the controller is configured to perform fifth writing on the fourth memory cell transistor after the fourth writing.

2. The memory system according to claim 1,
wherein the first string further includes
a fifth memory cell transistor connected to the second memory cell transistor on an opposite side to the first memory cell transistor, and
a sixth memory cell transistor connected to the fifth memory cell transistor on an opposite side to the second memory cell transistor, and
wherein the controller performs writing on the sixth memory cell transistor without performing writing on the fifth memory cell transistor after the fourth writing.

3. The memory system according to claim 1,
wherein the second string further includes a fifth memory cell transistor connected in series to the third memory cell transistor,
wherein a gate of the third memory cell transistor is connected to a gate of the second memory cell transistor,
wherein the fourth writing causes the third memory cell transistor to have a threshold voltage lower than a third target threshold voltage, and
wherein the controller is further configured to
perform sixth writing causing a threshold voltage of the fifth memory cell transistor to be lower than a fourth target threshold voltage after the fourth writing, and
perform seventh writing causing a threshold voltage of the third memory cell transistor to be higher than the third target threshold voltage after the sixth writing.

4. A memory system comprising:
a storage device including a first string to an s-th string (where s is a natural number of 2 or greater) each including a first memory cell transistor and a second memory cell transistor connected in series to each other, the first memory cell transistors of the first string to the s-th string being connected to each other, the second memory cell transistors of the first string to the s-th string being connected to each other, and the first string further including a third memory cell transistor; and
a controller configured to
perform first unit writing including first writing causing a threshold voltage of the first memory cell transistor to be lower than a first target threshold voltage, second writing causing a threshold voltage of the second memory cell transistor to be higher than a second target threshold voltage after the first writing, and third writing causing a threshold voltage of the first memory cell transistor to be higher than the first target threshold voltage after the second writing, on all of the first string to the s-th string for each of the first string to the s-th string, and
perform fourth writing on the third memory cell transistor after performing the first unit writing on all of the first string to the s-th string,
wherein the first string further includes a fourth memory cell transistor connected to the second memory cell transistor on an opposite side to the third memory cell transistor, and
wherein the controller is configured to perform the fourth writing without performing writing on the fourth memory cell transistor after performing the first unit writing on all of the first string to the s-th string.

5. The memory system according to claim 1,
wherein the first target threshold voltage is one of 2m (where m is a natural number of 2 or greater) threshold voltages, and
wherein the second target threshold voltage is one of 2p (where p is a natural number of below m) threshold voltages.

6. The memory system according to claim 5,
wherein m is 4.

* * * * *